(12) United States Patent
Zhang et al.

(10) Patent No.: US 10,719,645 B1
(45) Date of Patent: Jul. 21, 2020

(54) MODEL STRUCTURE ANALYSIS WITH INTEGRATION OF TRANSFORMED SLICE

(71) Applicant: The MathWorks, Inc., Natick, MA (US)

(72) Inventors: Fu Zhang, Sherborn, MA (US); Zhi Han, Acton, MA (US); Pieter J. Mosterman, Framingham, MA (US); William J. Aldrich, Sudbury, MA (US); Ebrahim Mehran Mestchian, Newton, MA (US); Denizhan N. Alparslan, Natick, MA (US); Richard Hyde, Blackmoor (GB)

(73) Assignee: The MathWorks, Inc., Natick, MA (US)

( * ) Notice: Subject to any disclaimer, the term of this patent is extended or adjusted under 35 U.S.C. 154(b) by 389 days.

(21) Appl. No.: 14/958,726

(22) Filed: Dec. 3, 2015

Related U.S. Application Data

(60) Continuation-in-part of application No. 13/910,100, filed on Jun. 4, 2013, which is a continuation-in-part of application No. 13/117,936, filed on May 27, 2011, now Pat. No. 8,812,276, which is a continuation-in-part of application No. 14/461,906, filed on Aug. 18, 2014, which is a division of
(Continued)

(51) Int. Cl.
*G06F 17/50* (2006.01)
*G06F 11/36* (2006.01)
*G06F 30/3323* (2020.01)
*G06F 8/10* (2018.01)

(52) U.S. Cl.
CPC ............ *G06F 30/3323* (2020.01); *G06F 8/10* (2013.01); *G06F 11/3608* (2013.01); *G06F 11/3664* (2013.01)

(58) Field of Classification Search
CPC ............ G06F 11/3608; G06F 11/3664; G06F 17/504; G06F 8/10
See application file for complete search history.

(56) References Cited

U.S. PATENT DOCUMENTS 5,850,560 A    12/1998  Kang
7,178,112 B1 *  2/2007  Ciolfi .................... G06F 17/504
                                                        703/2
(Continued)

FOREIGN PATENT DOCUMENTS

WO    WO-2007/022289 A2    2/2007

OTHER PUBLICATIONS

Han, Z. & Mosterman, P. "Detecting Data Store Access Conflict in Simulink by Solving Boolean Satisfiability Problems" American Control Conf., pp. 5702-5707 (2010).*
(Continued)

*Primary Examiner* — Jay Hann
(74) *Attorney, Agent, or Firm* — Cesari and McKenna, LLP

(57) ABSTRACT

A computer-based model having executable semantics may be used to simulate the behavior of a system. A substructure of interest is sliced from the model and analyzed to determine a transformation of the slice while preserving some context of the model. The transformed slice may be further manipulated outside of the model, integrated back into the model in place of the original slice, or used in other ways.

46 Claims, 21 Drawing Sheets

Related U.S. Application Data application No. 13/117,936, filed on May 27, 2011, now Pat. No. 8,812,276.

(60) Provisional application No. 61/348,969, filed on May 27, 2010.

(56) References Cited

U.S. PATENT DOCUMENTS

| | | | |
|---|---|---|---|
| 7,324,931 B1* | 1/2008 | Warlock | G06F 17/504 703/13 |
| 7,412,366 B1* | 8/2008 | Englehart | G06F 8/34 703/6 |
| 7,424,410 B2 | 9/2008 | Orofino, II et al. | |
| 7,434,183 B2 | 10/2008 | McGaughy et al. | |
| 7,464,373 B1 | 12/2008 | Yunt et al. | |
| 7,558,712 B1 | 7/2009 | Aldrich | |
| 7,590,614 B2 | 9/2009 | Fildebrandt et al. | |
| 7,644,398 B2 | 1/2010 | Cleaveland et al. | |
| 7,680,632 B1 | 3/2010 | Aldrich | |
| 7,680,637 B1* | 3/2010 | Wolodkin | G06F 17/5022 703/6 |
| 7,698,668 B2 | 4/2010 | Balasubramanian | |
| 7,701,869 B2 | 4/2010 | Hogan | |
| 7,774,172 B1* | 8/2010 | Yunt | G06F 17/5009 703/2 |
| 7,809,545 B2* | 10/2010 | Ciolfi | G06F 8/443 703/22 |
| 7,818,730 B1 | 10/2010 | Ryan et al. | |
| 7,912,692 B2 | 3/2011 | Matsushita et al. | |
| 7,934,194 B2 | 4/2011 | Kinnucan, Jr. et al. | |
| 7,941,299 B1 | 5/2011 | Aldrich et al. | |
| 8,041,554 B1* | 10/2011 | Limondin | G06F 11/3608 703/22 |
| 8,104,017 B2 | 1/2012 | Lin et al. | |
| 8,108,728 B2* | 1/2012 | Das | G06F 17/504 714/29 |
| 8,131,528 B1 | 3/2012 | Vora et al. | |
| 8,176,479 B2 | 5/2012 | Morrow et al. | |
| 8,522,196 B1* | 8/2013 | Kim | G06F 11/3664 717/100 |
| 8,620,629 B1* | 12/2013 | Li | G06F 17/5009 703/1 |
| 8,732,669 B2* | 5/2014 | Valdiviezo Basauri | G06F 11/3608 717/104 |
| 8,756,562 B2 | 6/2014 | Ciolfi et al. | |
| 9,021,409 B2 | 4/2015 | Vasudevan et al. | |
| 9,152,390 B1* | 10/2015 | Tripakis | G06F 8/36 |
| 9,183,120 B1 | 11/2015 | Webb | |
| 2003/0167182 A1 | 9/2003 | Bloom et al. | |
| 2007/0157162 A1 | 7/2007 | Ciolfi | |
| 2007/0266366 A1 | 11/2007 | Bucuvalas | |
| 2008/0092109 A1 | 4/2008 | Kinnucan, Jr. et al. | |
| 2008/0092111 A1 | 4/2008 | Kinnucan et al. | |
| 2008/0098349 A1 | 4/2008 | Lin et al. | |
| 2008/0172212 A1 | 7/2008 | Gahinet et al. | |
| 2008/0263506 A1 | 10/2008 | Broadfoot et al. | |
| 2009/0006062 A1 | 1/2009 | Sedukhin et al. | |
| 2009/0013307 A1 | 1/2009 | Raghavan et al. | |
| 2009/0077511 A1 | 3/2009 | Wahler et al. | |
| 2009/0098349 A1 | 4/2009 | Ichikawa | |
| 2009/0193396 A1 | 7/2009 | Hartadinata | |
| 2009/0234640 A1 | 9/2009 | Boegle et al. | |
| 2010/0299651 A1 | 11/2010 | Fainekos et al. | |
| 2011/0078652 A1* | 3/2011 | Mani | G06F 8/10 717/105 |
| 2011/0283260 A1 | 11/2011 | Bucuvalas | |
| 2011/0295578 A1 | 12/2011 | Aldrich et al. | |
| 2012/0179426 A1* | 7/2012 | Fontes | G06F 17/5018 703/1 |
| 2013/0326472 A1 | 12/2013 | Han et al. | |
| 2014/0358506 A1 | 12/2014 | Aldrich et al. | |
| 2014/0358507 A1 | 12/2014 | Aldrich et al. | |

OTHER PUBLICATIONS

Yang, G., et al. "Memoized Symbolic Execution" ISSTA'12, pp. 144-154 (2012).*

Wikipedia "Coupling (computing programming)" <https://en.wikipedia.org/wiki/Coupling_(computer_programming)> (Year: 2018).*

Xu, B., et al. "A Brief Survey of Program Slicing" ACM SIGSOFT Software Engineering Notes, vol. 30, No. 2 (2005) (Year: 2005).*

Silva, J. "A Vocabulary of Program Slicing-Based Techniques" ACM Computing Surveys, vol. 44, No. 3 (2012) (Year: 2012).*

Antoulas, et al., "A survey of model reduction methods for large-scale systems," Contemporary Mathematics, Oct. 27, 2006, pp. 1-28.

Clarke, et al., "Model checking and abstraction," ACM Transactions on Programming Languages and Systems, vol. 16, No. 5, Sep. 1994, pp. 1512-1542.

Fehnker, Ansgar & Krogh, Bruce, "Hybrid System Verification is Not a Sinecure: The Electronic Throttle Control Case Study," ATVA 2004, LNCS 3299, 2004, pp. 263-277.

Girard, et al., "Approximation metrics for discrete and continuous systems," University of Pennsylvania, Department of Computer & Information Science—Technical Reports (CIS), Nov. 2005, pp. 1-32.

Han, et al., "Detecting data store access conflict in Simulink by solving Boolean satisfiability problems," In American Control Conference (ACC'1 0), Jun. 2010, pp. 1-6.

Han, et al., "Reachability analysis of hybrid control systems using reduced-order models", In IEEE Proc of American Control Conference (ACC'04), Jun. 2004, pp. 1183-1189.

Han, et al., "Reachability analysis of nonlinear systems using trajectory piecewise linearized models," Proceedings of the 2006 American Control Conference, Jun. 14-16, 2006, pp. 1-6.

Heckel, "Graph transformation in a nutshell" Electron Notes Theory of Computer Science, Feb. 2006, pp. 187-198.

"Hinfnorm" Documentation Fact Sheet, MATLAB, The MathWorks, Inc., found online at <http://www.mathworks.com/help/robust/ref/hinfnorm.html?s_tid=gn_loc_drop&requestedDomain=www.mathworks.com>, Introduced in R2013B, retrieved from the internet Sep. 12, 2016, 3 pages.

Johnson, et al., "The program structure tree: computing control regions in linear time," In Proceedings of the ACM SIGPLAN 1994 conference on Programming language design and implementation, PLDI '94, 1994, pp. 171-185.

Kaga, et al., "Validation of control software specification using design interests extraction and model checking," In SAE 2012 World Congress and Exhibition, Apr. 24, 2012, pp. 1-13.

Kwiatkowski, et al., "Automated Generation and Assessment of Affine LPV Models" Proceedings of the 45th IEEE Conference on Decision & Control, Manchester Grand Hyatt Hotel, San Diego, CA, USA, Dec. 13-15, 2006, 6 pages.

"LPV Approximation of a Boost Converter Model" Documentation Fact Sheet, MATLAB, The MathWorks, Inc., found online at <http://www.mathworks.com/help/slcontrol/examples/lpv-approximation-of-a-boost-converter-model.html?searchHighlight=LPV>, R2016B, retrieved from the internet Sep. 12, 2016, 11 pages.

Matsubara, et al., "Model checking with program slicing based on variable dependence graphs," In Workshop on Formal Techniques for Safety-Critical Systems, Nov. 2012, pp. 56-68.

"Model Reduction" Documentation Fact Sheet, MATLAB, The MathWorks, Inc., found online at <http://www.mathworks.com/help/control/model-simplification-1.html>, R2016B, retrieved from the internet Sep. 12, 2016, 1 page.

"Notification of Transmittal of the International Search Report and the Written Opinion of the International Searching Authority, or the Declaration," International Filing Date: May 27, 2011, International Application No. PCT/US2011/000965, Applicant: The Mathworks, Inc., dated Oct. 6, 2011, pp. 1-10.

Pappas, "Bisimilar linear systems," Automatica 39, Jan. 2002, pp. 2035-2047.

Reicherdt, Robert, et al., "Slicing MATLAB Simulink Models," ICSE 2012, Proceedings of the 34th International Conference on Software Engineering, Zurich, Switzerland, IEEE, Jun. 2-9, 2012, pp. 551-561.

(56) References Cited

OTHER PUBLICATIONS

Rewienski, et al., "A trajectory piecewise-linear approach to model order reduction and fast simulation of nonlinear circuits and micromachined devices," IEEE Transaction on Computer-Aided Design of Integrated Circuits and Systems, vol. 22, No. 2, Feb. 2003, pp. 155-170.

"Simulink® Designer Verifier 1: User's Guide," The MathWorks, Inc., May 2007, pp. 1-485.

"Simulink® Verification and Validation 2: User's Guide," The MathWorks, Inc., Sep. 2007, pp. 1-829.

Tip, "A survey of program slicing techniques," Journal of Programming Languages, vol. 3, 1995, pp. 121-189.

Weiser, "Program slicing," IEEE Transactions on Software Engineering, vol. SE-10, No. 4, Jul. 1984, pp. 352-357.

Aldrich, William, "Using Model Coverage Analysis to Improve the Controls Development Process," AIAA Modeling & Simulation Technologies Conference & Exhibit, Monterey, CA, Aug. 5-8, 2002, pp. 1-11.

Kanade, Aditya, et al., "Generating and Analyzing Symbolic Traces of Simulink/Stateflow Models," Springer-Verlag Berlin Heidelberg, Proceedings of 21st International Conference on Computer Aided Verification, CAV 2009, available from <https://link.springer.com/chapter/10.1007/978-3-642-02658-4_33>, Jun. 26-Jul. 2, 2009, pp. 430-445.

Hyde, R. A., et al., "Fostering Innovation in Design and Reducing Implementation Costs by Using Graphical Tools for Functional Specification," American Institute of Aeronautics and Astronautics, Inc., The MathWorks Ltd, Aug. 2002, pp. 1-10.

Li, Dongguang, et al., "Analysis of Dual-Rate Inferential Control Systems," Brief Paper, Elsevier Science Ltd, Pergamon, Automatica, vol. 38, Issue 6, Jun. 2002, pp. 1053-1059.

Mohapatra, Durga Prasad, et al., "An overview of Slicing Techniques for Object-Oriented Programs," The Slovene Society Informatika, Ljubljana, Slovenia, Informatica, vol. 30, No. 2, Jun. 2, 2006, pp. 253-277.

Young, Nicholas, An Introduction to Hilbert Space: Chapter 2—Normed Spaces, Cambridge Mathematical Textbooks, ISBN 0-521-33717-8, Cambridge University Press, Cambridge, Great Britain, 1988, pp. 13-20.

Zhou, Kemin, et al., "Robust and Optimal Control: Chapter 7—Model Reduction by Balanced Truncation," Prentice Hall, Englewood Cliffs, New Jersey, ISBN 0-13-456567-3, 1996, pp. 153-168.

Daoudi, M., "An Investigation Into a Probabilistic Framework for Studying Symbolic Execution Based Program Conditioning," Thesis, Department of Computing, Goldsmiths College, University of London, 2006, pp. 1-132.

Harman, M., et al., "Pre/Post Conditioned Slicing," IEEE Computer Society, Proceedings of the IEEE International Conference on Software Maintenance (ICSM'01), Nov. 7-9, 2001, pp. 1-10.

Zanden, B., et al., "An Explanation-Based, Visual Debugger for One-Way Constraints," ACM, Proceedings of the 17th Annual ACM Symp. on User Interface Software & Tech. (UIST'04), Santa Fe, New Mexico, USA, vol. 6, Issue 2, available from <https://dl.acm.org/citation.cfm?id=1029670>, Oct. 24-27, 2004, pp. 207-216.

Tarjan, Robert, "Depth-First Search and Linear Graph Algorithms" SIAM J. Comput. vol. 1, No. 2, Jun. 1972 available at http://langevin.univ-tln.fr/cours/PAA/extra/Tarjan-1972.pdf , pp. 146-160.

Yusuf Karatoprak "Difference Between loose Coupling and Tight Coupling" available at https://www.c-sharpcorner.com/UploadFile/yusufkaratoprak/difference-between-loose-coupling-and-tight-coupling/ , Dec. 21, 2012, 9 pages.

Herzner, W., et al., "Model-based Development of Distributed Embedded Real-Time Systems iwth the DECOS Tool-Chain" SAE Int'l (2007) available from <http://saemobilus.sae.org/content/2007-01-3827> (year: 2007).

\* cited by examiner

To Fig. 11B

From Fig. 11A

To Fig. 11D

From Fig. 11C

US 10,719,645 B1

MODEL STRUCTURE ANALYSIS WITH INTEGRATION OF TRANSFORMED SLICE

CROSS-REFERENCE TO RELATED APPLICATIONS

The present application is a continuation-in-part of copending U.S. patent application Ser. No. 13/910,100, filed on Jun. 4, 2013 which is a continuation-in-part of U.S. patent application Ser. No. 13/117,936 filed May 27, 2011, which claims priority to U.S. Provisional Application No. 61/348,969 filed May 27, 2010. The present application is also a continuation-in-part of co-pending U.S. patent application Ser. No. 14/461,906 filed on Aug. 18, 2014 which is a divisional of U.S. patent application Ser. No. 13/117,936 filed on May 27, 2011 which claims priority to U.S. Provisional Application No. 61/348,969 filed May 27, 2010. The entire contents of each of the above-referenced applications is hereby incorporated by reference.

BRIEF DESCRIPTION OF THE DRAWINGS

The detailed description below refers to the accompanying drawings, of which.

DETAILED DESCRIPTION OF A PREFERRED EMBODIMENT

Figure 1A:
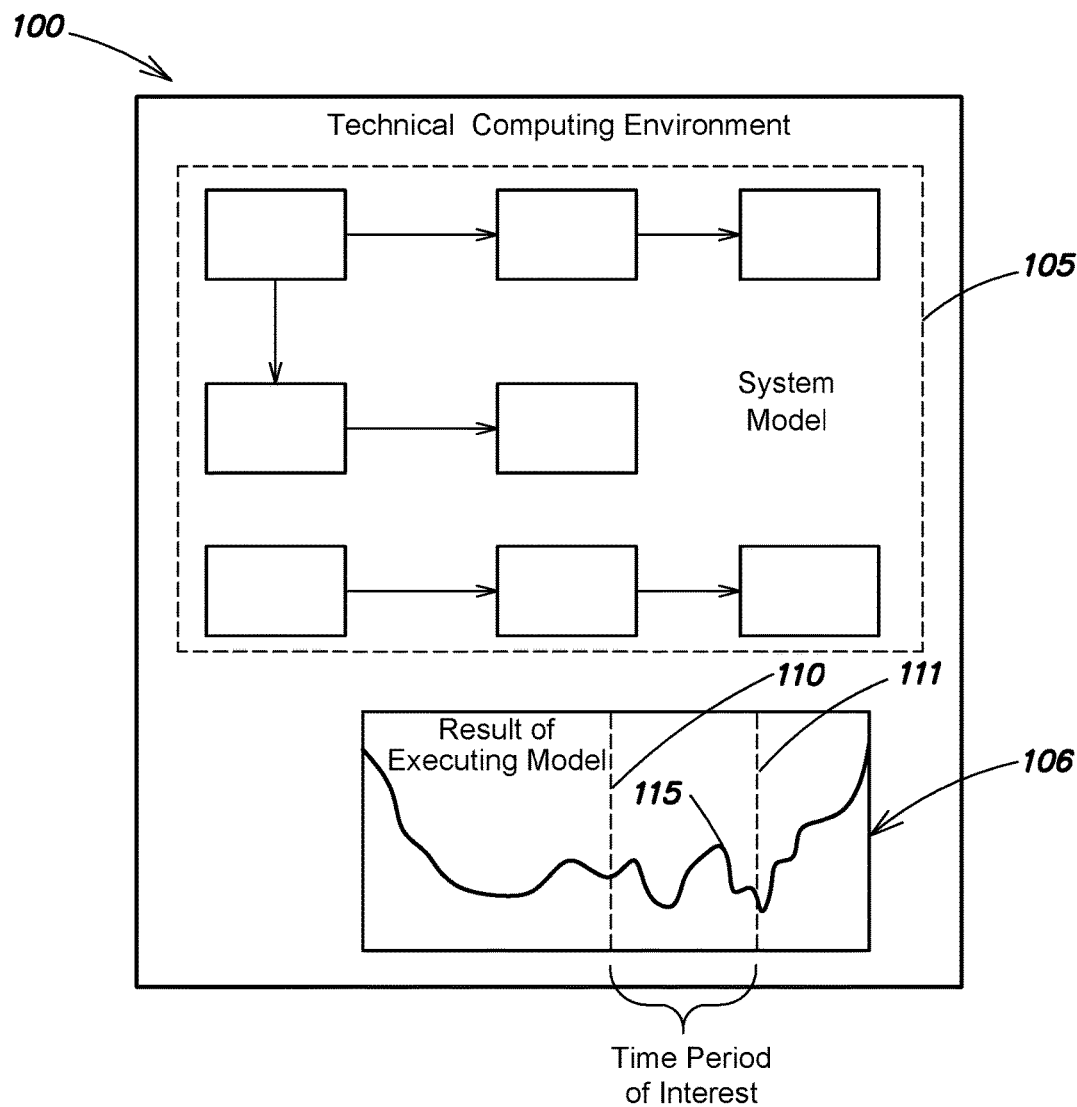
FIGS. 1A and 1B are diagrams illustrating an overview of an example implementation described herein.

The following detailed description of example implementations refers to the accompanying drawings. The same reference numbers in different drawings may identify the same or similar elements.

Computer-based tools are increasingly popular for modeling, simulating and analyzing dynamic systems prior to actually constructing them. These tools may use graphical block diagrams and a customizable set of block libraries as a primary interface. Simulink® available from The MathWorks, Inc. of Natick, Mass. is one such technical computing environment for multi-domain simulation and model-based design. Simulink and similar tools provide a graphical editor, customizable block libraries, and solvers for modeling and simulating dynamic systems. These tools allow a user to build a hierarchical model of a system with pre-defined library blocks to simulate the system's dynamic behavior. Further aspects of such tools permit analyzing simulation results to, for example, debug the model.

More particularly, a computer generated model having executable semantics may thus be used to simulate the behavior of a physical system. A user may analyze the model to better understand the existing design of the physical system and/or to determine ways to improve a particular behavior of the physical system (e.g., improve efficiency). Based on the analysis, the user may attempt to identify components of the model that may affect the particular behavior. The user may generate a design model that includes the identified components and is used to determine design changes for improving the particular behavior of the physical system.

As more and more changes are made to the physical system over time, the model used to simulate the physical system may become larger and more complex making it more difficult and/or time consuming for the user to identify components of the model affecting the particular behavior of the physical system. Systems and/or methods described herein may identify components of a model affecting a particular behavior of a physical system represented by the model thereby decreasing the time, effort, and computational resources required to implement design changes for improving the physical system.

In some implementations, the systems and/or methods may generate a model slice based on the components of the model affecting the particular behavior of the physical system represented by the model. The model slice may be a simplified model relative to the model of the physical system. Under a given set of constraints, the model slice may be an approximate simulation (as more fully explained below) or bisimulation (e.g., exhibit a same particular behavior) as the model of the physical system.

A user who is aware of configuration parameters in the model may want to determine if any of them need to be set to certain values. For example, the user may choose a solver option to assist with this determination. The user may, for example, determine that the solver cannot be a discrete solver because the model includes continuous states. In that instance, the solver may be a variable step solver. The tool may also provide an option whereby the user may select beforehand which of several solvers the system can use to correctly derive function evaluations. Or, the user may also simply select default choices suggested by the tool such as an Ordinary Differential Equation (ODE) solver. After keeping default values for other settings such as tolerances, time steps, and so forth the tool may simulate the model using the ODE solver and inspect the results.

In some instances, the user may not be able to determine if the default solver provided satisfactory simulation speed or accurate results. In a first instance, the user may not have any expertise in the numerical solution of ODEs for dynamic systems, and may not know how to choose among a long list of possible solvers. In another instance, the user may know which solver is appropriate. However, the solver may include a long list of configuration parameters and to determine how to set them, or, to know whether the default values are adequate for a particular use case, can be difficult to understand.

In some implementations, the block diagram models may be inspected to determine the presence of certain structures of interest, slicing such structures from the model, transforming sliced structures to provide a mutated slice that preserves at least some context of the original slice, and then integrating the mutated slice with other portions of the model, resulting in a mutated model.

I. Example Technical Computing Environment

Figure 1B:
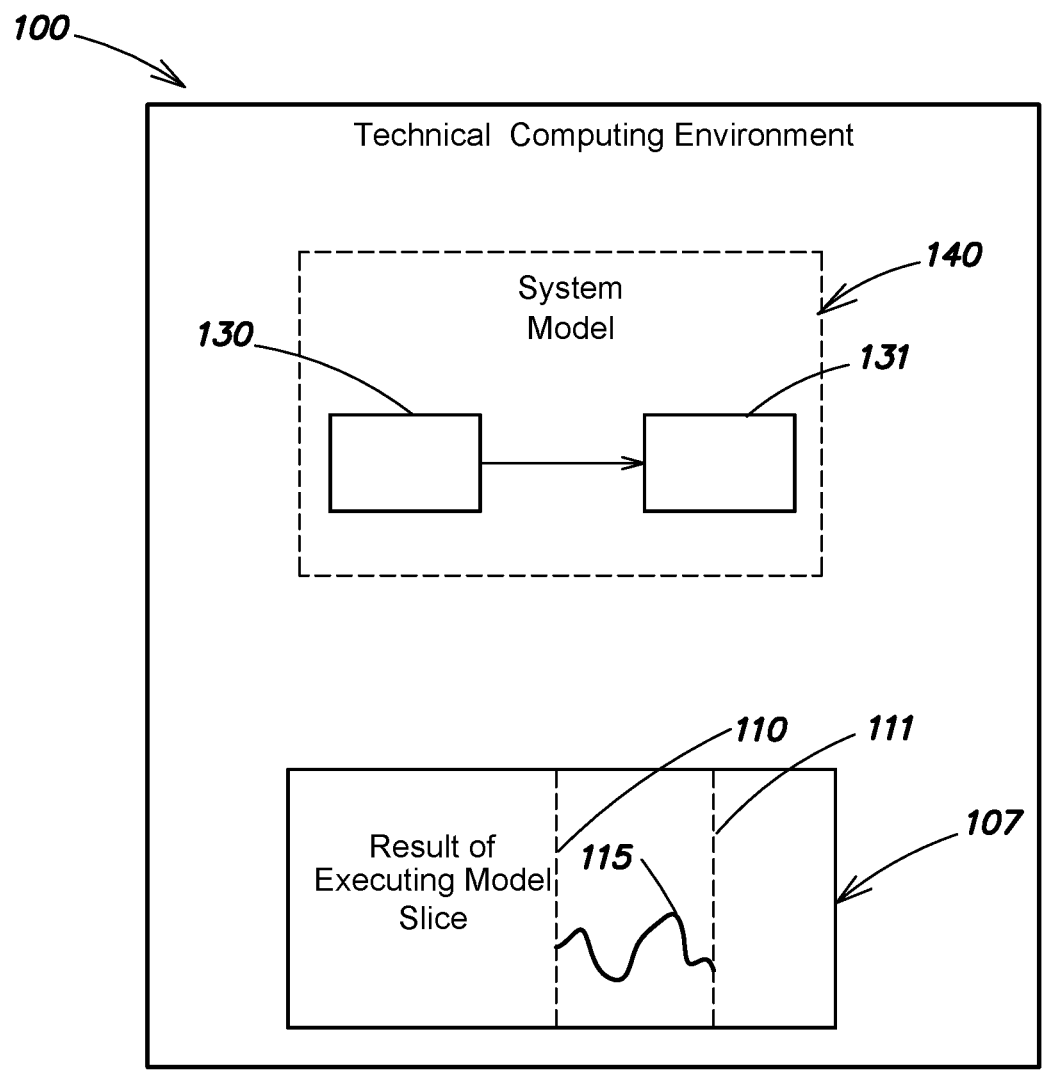

FIGS. 1A and 1B are diagrams illustrating an overview 100 of an example implementation described herein. For overview 100, assume that a user generates a model 105 of a physical system ("System Model") and simulates the behavior of the system by executing the model 105 in a technical computing environment. Further, assume that the technical computing environment provides, for display, a representation of the model 105 along with a result 106 of executing the model. Further, assume that, based on the result 106, the user has determined that the model 105 exhibits an undesired behavior for a specific simulation scenario during a particular period of time. Further, assume that the user has indicated interest in a behavior of the model 105 during the particular period of time.

As shown in FIG. 1A, the technical computing environment may display lines 110, 111 across a signal 115 output by the model 105. The displayed lines 110, 111 may correspond to the particular period of time indicated by the user.

Referring now to FIG. 1B, the technical computing environment may determine model elements 130, 131 that are active during the particular period of time and may generate a model slice 140 for the model. The model slice 140 may include only model elements 130, 131 that are active during the particular period of time and, when executed, may exhibit the same behavior exhibited by the model 105 during the particular period of time. As shown in FIG. 1B, the technical computing environment provides, for display, the model slice 140 along with the result 107 of executing the model slice. The model slice 140 exhibits an equivalent behavior as the model 105 during the particular period of time.

Figure 2A:
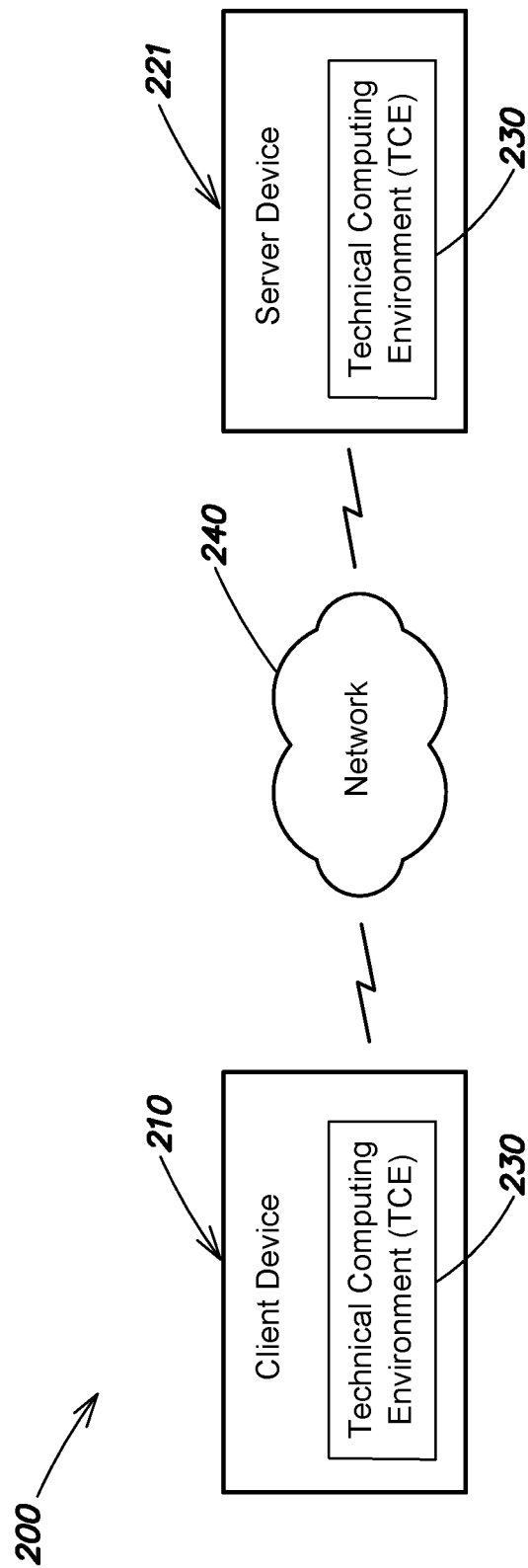
FIG. 2A is a diagram illustrating an example environment in which systems and/or methods described herein may be implemented.

FIG. 2A is a diagram of an example environment 200 in which systems and/or methods described herein may be implemented. As illustrated, environment 200 may include a client device 210 interconnected with a server device 221 via a network 240. Components of environment 200 may interconnect via wired and/or wireless connections. Client device 210 may include one or more devices that are capable of identifying components of a model that affect a particular behavior of a physical system represented by the model. For example, client device 210 may include a laptop computer, a personal computer, a tablet computer, a desktop computer, a workstation computer, a smart phone, a personal digital assistant (PDA), and/or other computation and communication devices. In some implementations, client device 210 may include a technical computing environment (TCE) 230, which is described in greater detail below.

Server device 221 may include one or more server devices, or other types of computation and communication devices, that gather, process, and/or provide information in a manner described herein. Server device 221 may include a device that is capable of communicating with client device 210 (e.g., via network 240). For example, server device 221 may include one or more laptop computers, personal computers, workstation computers, servers, central processing units (CPUs), graphical processing units (GPUs), application-specific integrated circuits (ASICs), field-programmable gate arrays (FPGAs), etc. In some implementations, server device 221 may include TCE 230 and may perform some or all of the functionality described herein for client device 210. In some implementations, server device 221 may be omitted and client device 210 may perform all of the functionality described herein.

TCE 230 may be provided within a computer-readable medium of client device 210. Alternatively, or additionally, TCE 230 may be provided in another device (e.g., server device 221) that is accessible by client device 210. TCE 230 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In some implementations, TCE 230 may include a dynamically-typed programming language (e.g., the M language, a MATLAB® language, a MATLAB-compatible language, a MATLAB-like language, etc.) that can be used to express problems and/or solutions in mathematical notations.

For example, TCE 230 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In some implementations, TCE 230 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 230 may further provide mathematical functions and/or graphical tools (e.g., for creating plots, surfaces, images, volumetric representations, etc.). In some implementations, TCE 230 may provide these functions and/or tools using toolboxes (e.g., toolboxes for signal processing, image processing, data plotting, parallel processing, etc.). Alternatively, or additionally, TCE 230 may provide these functions as block sets or in another way, such as via a library, etc.

TCE 230 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim (now Dassault Systemes; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim (now Dassault Systemes AB); SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhapsody or Tau from Telelogic (now IBM) (now IBM); Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

TCE 230 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3]

Now suppose the program is executed, for example, in a TCE, such as TCE 230. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

TCE 230 may provide mathematical routines and a high-level programming language suitable for non-professional programmers and may provide graphical tools that may be used for creating plots, surfaces, images, volumetric representations, or other representations. TCE 230 may provide these routines and/or tools using toolboxes (e.g., toolboxes for signal processing, image processing, data plotting, parallel processing, etc.). TCE 230 may also provide these routines in other ways, such as, for example, via a library, local or remote database (e.g., a database operating in a computing cloud), remote procedure calls (RPCs), and/or an application programming interface (API). TCE 230 may be configured to improve runtime performance when performing computing operations. For example, TCE 230 may include a just-in-time (JIT) compiler.

Network 240 may include a network, such as a local area network (LAN), a wide area network (WAN), a metropolitan area network (MAN), a telephone network, such as the Public Switched Telephone Network (PSTN) or a cellular network, an intranet, the Internet, or a combination of these and/or other types of networks.

Although FIG. 2A shows example components of environment 200, in some implementations, environment 200 may include fewer components, different components, differently arranged components, and/or additional components than those depicted in FIG. 2A.

Figure 2B:
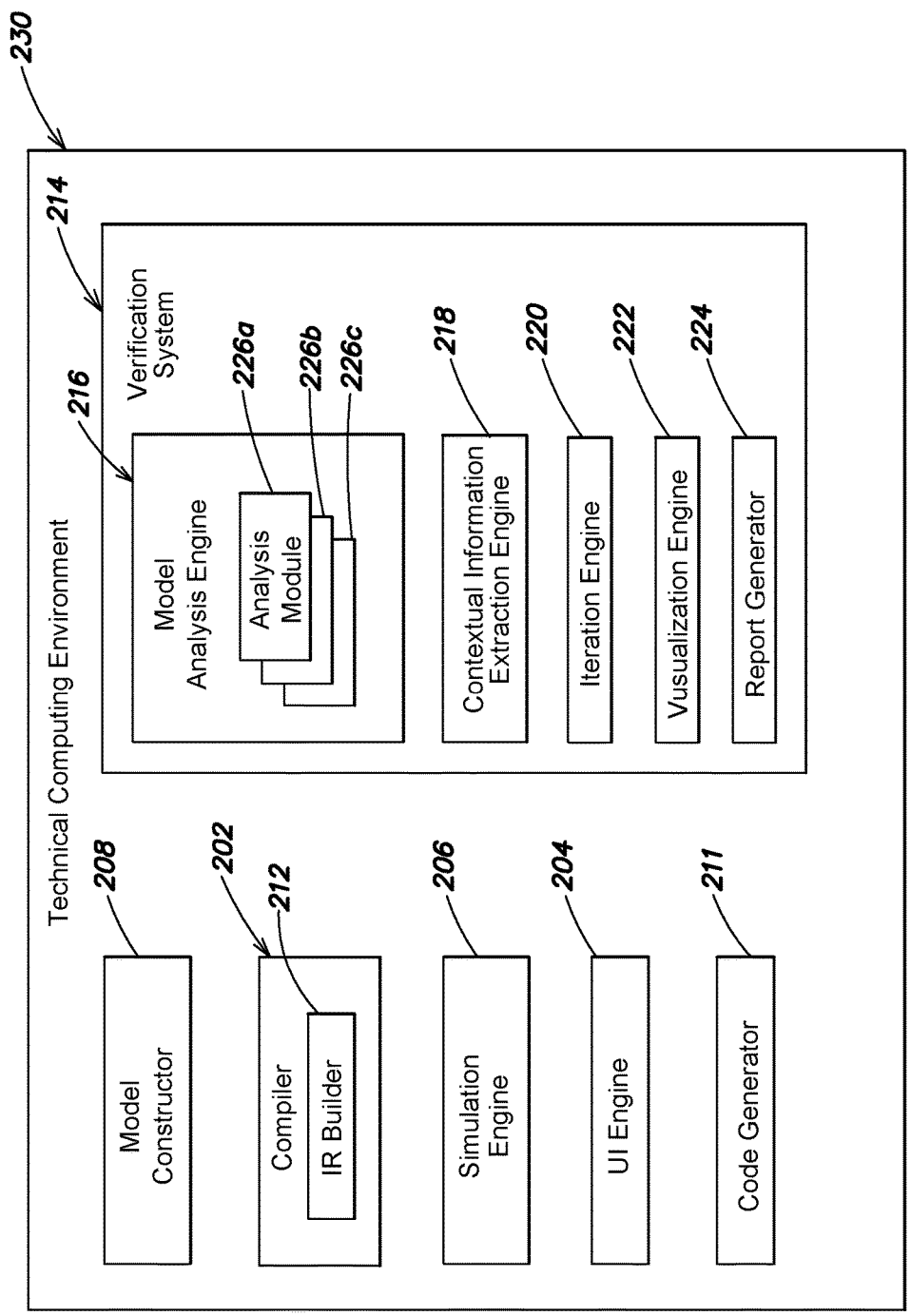
FIG. 2B is a partial functional block diagram of a high-level modeling environment.

FIG. 2B is partial block diagram of an embodiment of the technical computing environment 230. The TCE 230 may include a compiler 202, a user interface (UI) engine 204, a simulation engine 206, a model constructor 208, and a code generator 211. The compiler 202 may include one or more Intermediate Representation (IR) builders, such as IR builder 212.

In an embodiment, a verification system 214 may be integrated with the TCE 230. For example, the verification system 214 may be implemented as an add-on tool to the TCE 230, or it may be built-into the TCE 230, among other options. Alternatively, the verification system 214 may be separate from the TCE 230, but in communicating relationship with it. The verification system 214 may include a plurality of components or modules. In particular, the system 214 may include a model analysis engine 216, a contextual information extraction engine 218, an iteration engine 220, a visualization engine 222, and a report generator 224. The model analysis engine 216 may include one or more verification modules, such as verification modules 226 a-c.

In an implementation, TCE 230 may receive inputs by a user as the user creates, edits, revises, and/or opens one or more models, as indicated by arrow 228. The model created by the user may be a Simulink model, a Stateflow chart, a LabVIEW block diagram, a VEE diagram, a MATLAB file, etc. The model may represent a dynamic system, such as an aircraft flight controller, an engine control unit (ECU), an embedded system, etc. The simulation engine 206 simulates, e.g., executes, the model. That is, icons or blocks of the model may represent computations, functions, operations, or states, and interconnecting lines or arrows among those blocks may represent data, signals, events, or mathematical relationships among those computations, functions, operations, or states. The icons or blocks may be selected by the user from one or more libraries or palettes that contain icons for the blocks supported by the TCE 230.

The UI engine 204 may provide or support a graphical user interface (GUI) having a Run button that may be selected by the user. The UI engine 204 may also provide or support a Command Line Interface (CLI) that may receive a run command entered by the user. In response to the user selecting the Run button or entering the run command, the simulation engine 206 may execute or run the model, and may present the results generated by the model's execution to the user via the display 120.

The UI engine 204 may also provide or support a Code Generation button or option that may be selected by the user, or the UI engine 204 may receive a code generation command entered by the user, e.g., in the GUI or the CLI. In response to the user selecting the Code Generation button or entering the code generation command, the code generator 211 may generate code for at least part of the model, and may store the results of the code generation operation in memory. For example, the code generator 211 may produce computer programming code, or hardware description code corresponding to the model created by the user, as indicated by arrow 224. Exemplary computer programming code includes C code, C++ code, etc., and exemplary hardware description code includes VHDL, Verilog, SystemC, embedded MATLAB, and vendor or target specific HDL code, such as Xilinx FPGA libraries, etc.

In an embodiment, example suitable code generators include the Simulink® Coder™ product and the HDL Coder™ product both from The MathWorks, Inc. Example suitable model analysis engines include the Simulink® Design Verifier™ and Simulink® Verification and Validation™ products both from The MathWorks, Inc. Another example of a suitable product is TargetLink from dSpace GmbH of Paderborn Germany. Another example of a model analysis engine is the Embedded Validator product from BTC Embedded Systems AG of Oldenburg Germany. Those skilled in the art will understand that other code generation systems and model analysis engines may be used.

The TCE 230 may further include one or more debugging facilities (not shown) that may, for example, allow halting a simulation at one or more breakpoints. A breakpoint may be specified for a variable, for example, to halt execution when the variable value changes. A breakpoint also may be conditional, for example, only halting execution when a variable value changes and the current time of execution is in a certain time interval, or only halting execution when a variable has changed a specified number of times.

The model analysis engine 216, contextual information extraction engine 218, iteration engine 220, visualization engine 222, report generator 224, and analysis modules 226 may each comprise registers and combinational logic configured and arranged to produce sequential logic circuits. In an embodiment, the model analysis engine 216, contextual information extraction engine 218, iteration engine 220, visualization engine 222, report generator 224, and analysis modules 226 may be implemented through one or more software modules or libraries containing program instructions pertaining to the methods described herein. The software modules may be stored on main memory 104 and/or computer readable media, such as computer readable medium 126, and executable by one or more processing elements, such as processing element 102. Other computer readable media may also be used to store and execute these program instructions. In alternative embodiments, various combinations of software and hardware, including firmware, may be utilized to implement the present invention. In response to the user inputs, the model constructor 207 may build a model that may be presented to the user, for example, on a display.

Figure 3:
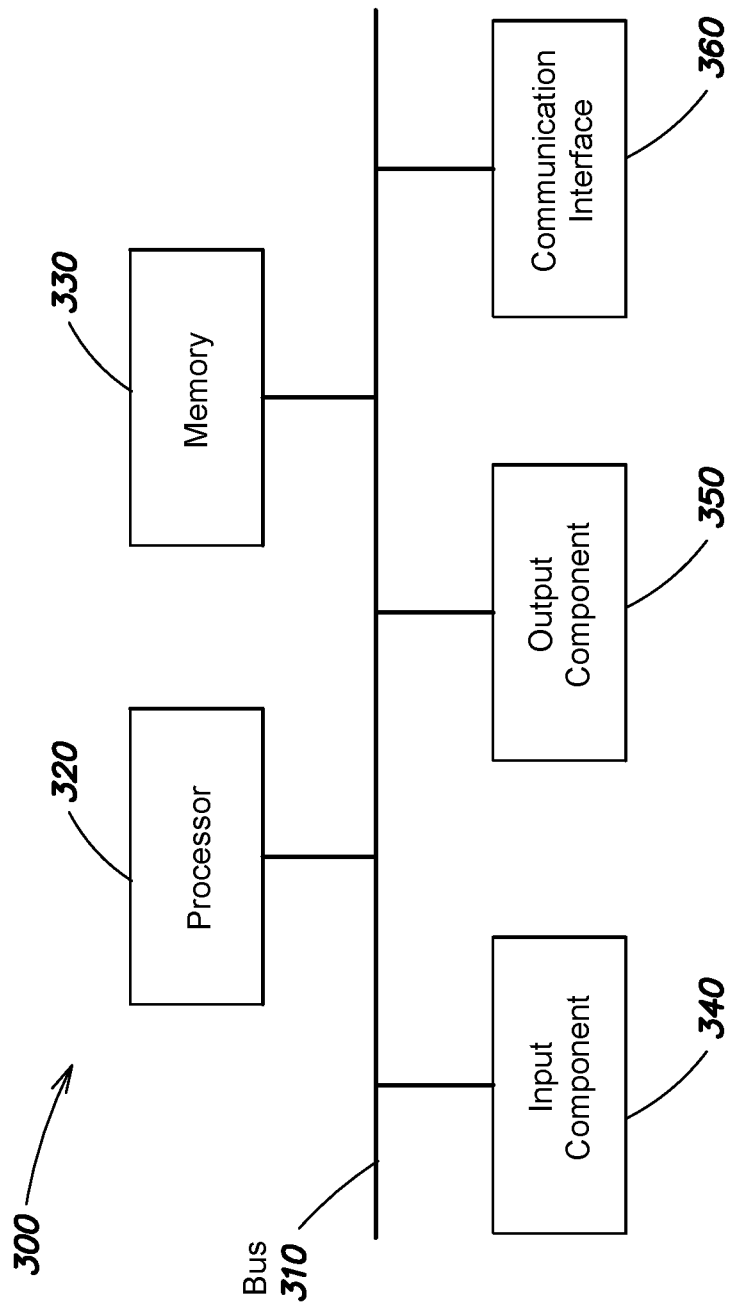
FIG. 3 is a diagram of example components of a device that may be used within the environment of FIGS. 2A and 2B according to one or more implementations described herein.

FIG. 3 is a diagram of example components of a device 300. Device 300 may correspond to client device 210 and/or server device 221 or other components, elements, or blocks of technical computing environment 230. Additionally, or alternatively, each of client device 210 and/or server device 221 or other elements of TCE 230 may include one or more devices 300 and/or one or more components of device 300. As illustrated in FIG. 3, device 300 may include a bus 310, a processor 320, a memory 330, an input component 340, an output component 350, and a communication interface 360.

Bus 310 may include a path that permits communication among the components of device 300. Processor 320 may include a processor (e.g., a central processing unit, a graphics processing unit, an accelerated processing unit), a microprocessor, and/or any processing logic (e.g., a field-programmable gate array (FPGA), an application-specific integrated circuit (ASIC), etc.) that interprets and/or executes instructions. Memory 330 may include a random access memory (RAM), a read only memory (ROM), and/or another type of dynamic or static storage device (e.g., a flash, magnetic, or optical memory) that stores information and/or instructions for use by processor 320. Input component 340 may include a component that permits a user to input information to device 300 (e.g., a touch screen display, a keyboard, a keypad, a mouse, a button, a camera, a microphone, a switch, etc.). Output component 350 may include a component that outputs information from device 300 (e.g., a display, an audio speaker, one or more light-emitting diodes (LEDs), etc.).

Communication interface 360 may include a transceiver-like component, such as a transceiver and/or a separate receiver and transmitter that enables device 300 to communicate with other devices, such as via a wired connection, a wireless connection, or a combination of wired and wireless connections. For example, a communication interface 360 may include an Ethernet interface, an optical interface, a coaxial interface, an infrared interface, a radio frequency (RF) interface, a universal serial bus (USB) interface, or the like.

Device 300 may perform various operations described herein. Device 300 may perform these operations in response to processor 320 executing software instructions included in a computer-readable medium, such as memory 330. A computer-readable medium may be defined as a non-transitory memory device. A memory device may include memory space within a single physical storage device or memory space spread across multiple physical storage devices.

Software instructions may be read into memory 330 from another computer-readable medium or from another device via communication interface 360. When executed, software instructions stored in memory 330 may cause processor 320 to perform one or more processes described herein. Additionally, or alternatively, hardwired circuitry may be used in place of or in combination with software instructions perform one or more processes described herein. Thus, implementations described herein are not limited to any specific combination of hardware circuitry and software.

The number of components shown in FIG. 3 is provided for explanatory purposes. In practice, device 300 may include additional components, fewer components, different components, or differently arranged components than those shown in FIG. 3.

II. Process for Generating a Model Slice

Figure 4A:
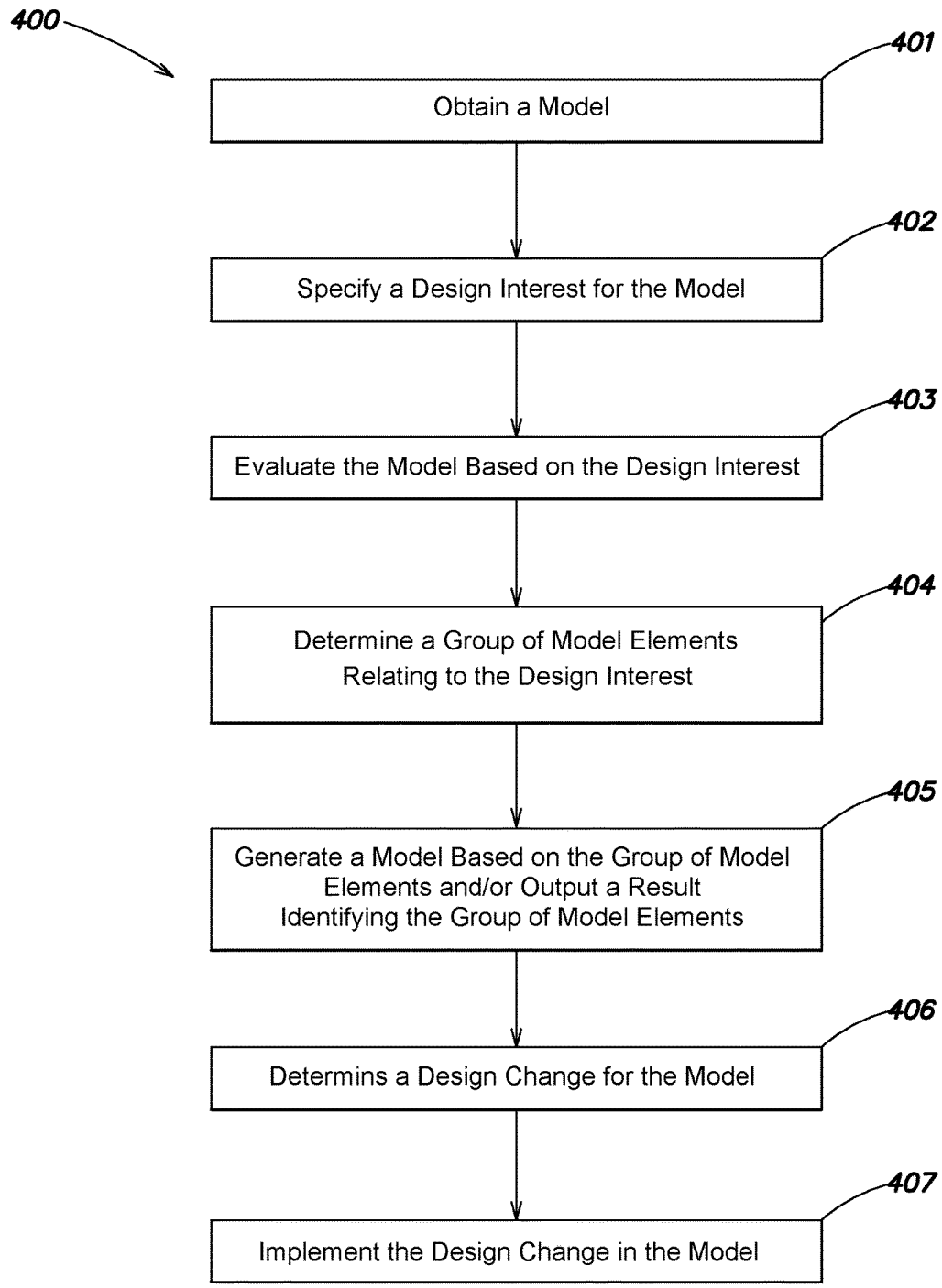
FIG. 4A is a flow chart of an example process for generating a model slice of a model.

FIG. 4A is a flow chart of an example process 400 for generating a model slice of a model. In some implementations, process 400 may be performed by client device 210 (e.g., TCE 230). In some implementations, one or more blocks of process 400 may be performed by one or more devices instead of, or possibly in conjunction with, client device 210.

As shown in FIG. 4A, process 400 may include obtaining a model (block 401). For example, a user of client device 210, may generate a 2D representation and/or a spatial representation associated with one or more physical elements of a system. The user may cause the model to be stored in a memory. Client device 210 (e.g., TCE 230) may obtain the model from the memory.

Process 400 may include specifying a design interest for the model (block 402). For example, the model may include a group of model elements corresponding to the one or more physical elements of the system. A user, such as, for example, an engineer, may specify a design interest for generating a model slice of the model. The model slice may be a simplified model relative to the model and may exhibit a same set of behaviors as the model under an assumption of the slicing criteria. Client device 210 (e.g., TCE 230) may receive information identifying the design interest from the user.

In some implementations, client device 210 may provide the model, including the group of model elements, for display, via a user interface. The user may be interested in an operation of a particular model element included in the group of model elements. The user may interact with the user interface to designate the particular model element as a design interest for the model.

In some implementations, the design interest may include one or more constraints related to evaluating the model, such as, for example, performing a formal static analysis on the model. The constraint may limit or constrain an execution of the model and/or a performance of the formal static analysis. For example, the constraint may identify a time period during which the model is to be evaluated (e.g., the first 3 seconds, the last 5 seconds, from t=1 to t=5, a first time a model element is in a particular state until the model element leaves the particular state, a first time interval during which a particular signal (e.g. an enable signal) corresponds to true, etc.), constrain one or more inputs of the model (e.g., set an input to a particular value, limit the input to a particular range of values, etc.), constrain one or more outputs of the model, require a state of one or more model elements included in the model to remain constant, etc.

In some implementations, the design interest may identify a scope of analysis associated with evaluating the model. The scope of analysis may define a domain of interest associated with the design interest (e.g., a particular model element). For example, the design interest may identify a set of signals input to the model, a set of signals output by the model, a subsystem or a sub-model included in the model, a state of the model, a state event, a data store memory, a set of all zero-crossing events of a hybrid system model, etc.

In some implementations, the domain of interest may be defined as including model elements that contribute to overall dynamics of the model, model elements that do not contribute to the overall dynamics of the model, and/or signals of the model that are active under a particular constraint.

In some implementations, the domain of interest may be defined in terms of a subsystem and/or a sub-model of the model. For example, the design interest may indicate that all of the model elements included in a particular subsystem of the model are to be excluded from the evaluation of the model. In some implementations, such as when inputs and/or outputs have a directional relationship with elements of the model, the scope of analysis may indicate that the model is to be evaluated upstream and/or downstream with respect to a set of constraints.

As an example, assume that the particular model element has ten output ports and that the user is interested in a particular group of the ten output ports (e.g. the first five output ports). The design interest may identify the particular group of output ports and/or may identify a set of values to which the particular group of output ports are to be set.

In some implementations, information identifying one or more portions of the design interest may be provided via a user interface. For example, client device 210 may provide one or more portions of the model for display to the user. The user may select (e.g., using a mouse) a particular model element to be included in the design interest. In response to the selection of the particular model element, client device 210 may provide a user interface for providing information identifying one or more constraints and/or the one or more scopes of analysis.

Process 400 may include evaluating the model based on the design interest (block 403). For example, client device 210 (e.g., TCE 230) may obtain the design interest and may identify a particular model element, a constraint, and/or a scope of analysis associated with evaluating the model. Client device 210 may evaluate the model by performing one or more different types of analysis of the model. In some implementations, the analysis may include a dependence analysis that determines a dependence between model elements. The dependence analysis may be based on the execution activities of the model elements. For example, a formal static analysis or a dynamic analysis may determine that a model element is in a particular state. The dependence analysis may analyze the model with the model element being held in the particular state.

In some implementations, the analysis of the model may include a dynamic analysis of the model. The dynamic analysis may analyze dynamics of the model, or generate the dynamic behavior by executing the model. Client device 210 may determine execution activities of the model elements based on the analysis. For example, the design interest may include a constraint that identifies a particular period of time (e.g., a first 3 seconds of an execution of the model, the last 5 seconds of an execution of the model, from t=1 to t=5 during an execution of the model, from a first time a model element is in a particular state until a time when the model element leaves the particular state, a time interval during which a particular signal (e.g. an enable signal) first corresponds to true, etc.). Client device 210 may execute the model and may collect coverage information for the model during the particular period of time. Client device 210 may determine a group of model elements that are in an active state and/or are required for evaluating the operation of the particular model element based on the coverage information.

In some implementations, the coverage information may include code coverage information. For example, each model element in the model may correspond to one or more code segments for executing the model element. Client device 210 may assemble the one or more code segments for each model element in an arrangement to allow the model to be executed. Client device 210 may execute the model based on the assembled arrangement of the one or more code segments. During the execution, client device 210 may determine whether a code segment has executed at least once during the particular period of time. Client device 210 may determine that a model element is in an active state during the particular period of time when a code segment associated with the model element is executed at least once during the particular period of time. Client device 210 may also determine whether a code segment has evaluated to one or more specific values (e.g., True and False).

In some implementations, the coverage information may include model coverage information. For example, client device 210 may execute the model using test cases that were determined based on the one or more constraints and/or the one or more scopes of analysis. For example, the design interest may identify a set of input values that may be received by the model during a particular period of time. Client device 210 may determine a test case based on the model receiving the set of input values during the particular period of time. Client device 210 may use the test case during execution of the model and may collect model coverage information during the particular period of time.

In some implementations, the model coverage information may include one or more input values, one or more output values, one or more values in state charts, etc. resulting from the model receiving the set of input values during the particular period of time and generating output values based on the set of input values. Client device 210 may determine that a model element is in an active state during the particular period of time based on an input value, an output value, a state chart value, etc. collected for the model element. For example, client device 210 may determine that a value of the output for the model element is greater than zero. Client device 210 may determine that the model element is in the active state based on the value of the output being greater than zero.

Additionally, or alternatively, client device 210 may perform a formal static analysis of the model. In some implementations, in those instances where client device 210 performs the dynamic analysis of the model, client device 210 may perform the formal static analysis of the model prior to performing the dynamic analysis of the model or after performing the dynamic analysis of the model. Thus, client device 210 may perform a dynamic analysis of the model, a formal static analysis of the model, a dynamic analysis followed by a formal static analysis of the model, or a formal static analysis followed by a dynamic analysis of the model.

In some implementations, in those instances when the formal static analysis is to be performed, client device 210 may perform the formal static analysis using formal methods, such as, for example, model checking and/or abstract interpretation. In some implementations, client device 210 may determine, based on the design interest, one or more constraints on a state of the model, one or more constraints on an input received by the model, and/or one or more scopes of analysis related to the formal static analysis. Client device 210 may perform the formal static analysis based on the one or more constraints on the state of the model, the one or more constraints on the input, and/or the one or more scopes of analysis. In some implementations, the one or more constraints on the state of the model, the one or more constraints on the input, and/or the one or more scopes of analysis may correspond to one or more test cases for analyzing a particular behavior of the model.

In some implementations, the design interest may identify a state value constraint. The state value constraint may identify one or more elements of the model that are to be held in a particular state (e.g., active or inactive, enabled or disabled, or within a value range). For example, the model may include a group of model elements corresponding to a transmission system of a vehicle. The state value constraint may specify that the transmission system is to be in a particular gear (e.g., third gear). Client device 210 may perform the formal static analysis of the model with the transmission system (e.g., the group of model elements) held in the particular gear.

In some implementations, the design interest may identify a signal value constraint. The signal value constraint may identify one or more input values and/or one or more output values to be applied to an input and/or an output of one or more model elements. For example, the design interest may include a constraint that specifies that an output of a model element is set to a particular value. Client device 210 may set the output of the model element to the particular value and may perform the formal static analysis of the model.

As an example, assume that the model includes a logic block and that an output of the logic block may be a signal corresponding to True or a signal corresponding to False. The constraint may require that the output of the logic block be set to the signal corresponding to True during the execution of the model. Client device 210 may set the output of the logic block to output the signal corresponding to True and may perform the formal static analysis of the model.

In some implementations, the design interest may identify a frequency constraint. The frequency constraint may specify a frequency of one or more input values and/or one or more output values to be applied to an input and/or an output of one or more model elements. For example, the design interest may include a constraint that specifies that an input signal received by a model element is a sinusoidal signal with a frequency of 20 Hz, a sinusoidal signal with a frequency of less than 10 kHz, etc. Client device 210 may set the input signal based on the frequency constraint and may perform the formal static analysis of the model.

In some implementations, the formal static analysis may include compiling one or more portions of the model and/or generating one or more in-memory representations of the model. For example, client device 210 may generate one or more intermediate representations (IRs) associated with the model. In some implementations, client device 210 may generate an IR of the model and/or an IR of the one or more constraints. For example, client device 210 may generate an IR for the model that includes a group of nodes connected by one or more edges. The group of nodes may represent model elements included in the model. The one or more edges may represent one or more connections between the model elements in the model.

Client device 210 may analyze one or more decision points of the model (e.g., whether a switch block causes a signal to be passed to one portion of the model or to another portion of the model) based on the IR of the model. Client device 210 may identify the group of model elements that are in an active state and/or are required for evaluating the operation of the particular model element based on analyzing the decision points.

In some implementations, client device 210 may evaluate the decision points by following a flow of data backwards through the model to determine data dependencies between model elements included in the model and/or by propagating a signal value forward through the model. For example, the design interest may include a first signal value constraint that sets a value of an output included in the model to a first value and a second signal value constraint that sets a value of an input to a second value.

In some implementations, client device 210 may follow the flow of data backwards through the model by setting the output to the first value and identifying a model element connected to the output. Client device 210 may determine a data dependency between the output and the model element based on the model element being connected to the output. Client device 210 may continue to follow a flow of data backwards through the model in a similar manner.

In some implementations, client device 210 may propagate the first value forward through the model by setting the input to the second value. For example, client device 210 may determine that the input provides an input to a switch block included in the model. The switch block may provide a received input to a first model element when the received input is within a particular range of values and may provide the input to a second model element when the received input is not within the particular range of values.

By way of example, assume that client device 210 determines that the received input is within the range of values when the input is set to the second value. Client device 210 may determine that the switch block provides the received input to the first model element based on the received input being within the particular range of values. Client device 210 may determine that the first model element is in an active state and/or that the second model element is in an inactive state when the received input is within the range of values. Client device 210 may follow a direction of output to input dependencies, which in some embodiments, may correspond to a flow of data forward through the model in a similar manner to identify model elements that are in an active state when the received input is within the range of values.

In some implementations, the IR of the model may include a design verifier intermediate representation (DVIR) and data structures used to determine dependencies of model elements. In some implementations, conditional regions in the model (e.g., an IF block, a switch, etc.) may be instrumented with check expressions. In some implementations, constraints included in the design interest may be incorporated as algebraic constraints of a state of the model and/or as input variables. The DVIR may then be analyzed to determine execution activities of regions and/or model elements of the model.

Process 400 may include determining a group of model elements relating to the design interest (block 404) and generating a model slice based on the group of model elements and/or outputting a result identifying the group of model elements (block 405). For example, client device 210 (e.g., TCE 230) may determine an execution status (e.g., enabled, disabled, triggered, not triggered, active, inactive, etc.) of the model elements included in the model. Client device 210 may identify one or more model elements that have an active status (e.g., enabled, triggered, active, etc.) when the model is evaluated with respect to the design interest. Client device 210 may generate the model slice based on the one or more model elements having the active status and/or may output a result identifying the one or more model elements having the active status.

In some implementations, the design interest may identify a set of signals associated with the scope of analysis. Client device 210 may identify one or more model elements that do not depend on the set of signals (e.g., one or more model elements that are inactive, disabled, not triggered, not connected/in a transitive closure in a graph intermediate representation, etc.). Client device 210 may determine that the identified one or more model elements are not related to the design interest and/or that a set of other model elements (e.g., model elements that depend on the set of signals) are related to the design interest. Client device 210 may generate the model slice based on the set of other model elements and/or may output a result identifying the set of other model elements.

In some implementations, client device 210 may determine the group of model elements based on code coverage information. For example, client device 210 may obtain code coverage information associated with performing the coverage analysis of the code generated for the model. Client device 210 may analyze the code coverage information to identify one or more code segments that executed at least once during the coverage analysis. The one or more code segments may implement one or more model elements included in the model. Client device 210 may determine that the one or more model elements were in an active state based on the one or more code segments executing at least once during the coverage analysis and, therefore, that the one or more model elements are related to the design interest. Client device 210 may generate the model slice based on the one or more model elements being in the active state and/or may output a result identifying the one or more model elements in the active state.

In some implementations, client device 210 may determine the group of model elements based on model coverage information. For example, client device 210 may obtain model coverage information determined based on executing the model. The model coverage information may include information relating to signals received and/or output by one or more model elements included in the model or may include internal computations that represent the functionality of the model elements. For example, the model may include a switch block that provides an output to a first portion of the model when an input to the switch block is less than a particular value and provides an output to a second portion of the model when the input is greater than or equal to the particular value. Based on the model coverage information, client device 210 may determine that, during the particular time period, the input to the switch block is always greater than the particular value. Client device 210 may determine that the model elements included in the second portion of the model are in an active state during the particular time period and/or that model elements in the first portion of the model are not in an active state during the particular time period. Client device 210 may determine that the model elements in the second portion of the model are related to the design interest based on the model elements being in the active state during the particular time period. Client device 210 may generate the model slice based on the model elements in the second portion of the model and/or may output a result identifying the model elements in the second portion of the model.

In some implementations, client device 210 may determine the group of model elements related to the design interest based on performing the formal static analysis of the model. For example, client device 210 may obtain a result of performing the formal static analysis of the model based on the one or more constraints. The result may include information identifying a group of model elements that are in an active state based on applying the one or more constraints to the model. Client device 210 may determine that the group of model elements in the active state are related to the design interest. Client device 210 may generate the model slice based on the group of model elements being in the active state and/or may output a result identifying the group of model elements in the active state.

Client device 210 may define an execution graph for the model as EG=(S∪P, E) where V=S∪P is a set of vertices partitioned from a set of signal vertices S and a set of procedure vertices P, and E⊆V×V is a set of edges. In some implementations, the procedures in the execution graph correspond to blocks of statements. The execution graph may be a hybrid directed graph that captures both variable dependence and procedure dependence. For example, for the execution graph EG=(V, E) and a vertex v, client device 210 may define a vertex elimination graph as:

$$EG\backslash v = (V\backslash v, E \cup \{(x,y)|x \to v \text{ and } v \to y\} \{(x,v)|x \to v\} | \{(v,y)|v \to y\}),$$

where \ is the standard set difference operation for the set of vertices and edges. In some implementations, client device 210 may determine a relationship between execution context of non-virtual subsystems included in the model. In some implementations, client device 210 may determine the execution context based on an execution tree (e.g., a program structure tree). Client device 210 may determine that an execution tree T=(V, E) is an undirected graph that is a rooted tree based on the execution tree satisfying certain criteria, such as, for example, T is connected, T has no cycles, and T has a unique node r called the root.

In some implementations, client device 210 may determine that a dynamic analysis structure for the execution tree is a four-tuple (EG, T, f) with an execution graph EG=$(S_g \cup P_g, E_g)$, an execution tree T=$(V_T, E_T)$, and two maps that associate the graph procedure vertices with tree nodes: f: $P_g \to V_T$ may associate an execution tree node with every procedure node in the execution graph; and $f^{-1}: V_T \to P_g \cup p_0$ may associate a procedure in the execution graph with a node in the execution tree. For tree nodes that do not have an associated procedure vertex, client device 210 may map the tree node to a special vertex $p_0$.

In some implementations, the model may be associated with a conditional execution context (CEC) tree (e.g., a unique rooted execution tree). Every leaf node in the CEC tree may be associated with a non-virtual model element of the model and every non-leaf node in the CEC tree may be associated with a non-virtual subsystem in the model. For a non-virtual model element, the maps f(v) and $f^{-1}(t)$ may associate the execution graph node with an execution tree node that correspond to that non-virtual model element.

In some implementations, the model may be associated with a program structure tree (PST). The leaf nodes in the PST may be basic regions in the model and the non-leaf nodes may be other regions in the model. Each region may have an associated tree node in the execution tree. Each basic region may have an associated vertex in the execution graph. The map f(v) may associate the vertex in the execution graph with a corresponding node in the execution tree. The map $f^{-1}(v)$ may map all tree nodes of the basic regions with a corresponding vertex in the execution graph and may map all tree nodes of the other regions to $v_0$.

In some implementations, client device 210 may determine that a rooted tree imposes a partial order on the nodes in the execution tree. A node u is less than, or equal to Tv if, and only if, the unique path from the root to v passes through u. Client device 210 may determine that the node u dominates v if u is less than, or equal to Tv The dominance relationship of the CEC tree may determine execution activities of procedures of non-virtual model elements included in the model. For example, if a subsystem associated with a non-leaf node u is disabled, client device 210 may determine that all procedures associated with descendant nodes of the non-leaf node u are disabled. In these instances, client device 210 may determine that the data dependency at the inactive procedures are also inactive and may use a disabled value of the subsystem instead of an output value of the subsystem (e.g., a result corresponding to the inactive model elements being disconnected from an output signal of the inactive model elements in the execution graph). Client device 210 may determine an active set of model elements and a dependent set of model elements based on the execution tree and/or the execution graph for the model and may implement a mapping of a simulation state for the model as a straightforward projection of a complete simulation state of the model to simulation states of the active and dependent model elements.

In some implementations, because a simulation state is dependent upon execution, a variable that is a simulation state variable in the model may become a non-state variable in the model slice. For example, client device 210 may determine that a subsystem in the model is disabled. Client device 210 may determine that an output value for the subsystem is a constant value based on the subsystem being disabled. Client device 210 may remove the subsystem when generating the model slice and may replace a signal output of the subsystem with a constant block having a value that is set at an initial output of the subsystem.

The following is an example of pseudo-code for analyzing a semantic model to generate a model slice based on an execution tree and an execution graph for the model:
function [activeBlk, activeSignal]=analyze_dependence (mdl, cvd, start)
   g=create_execution_graph (mdl);
   t=create_CEC_tree (mdl);
   act=analyze_execution_activity (mdl, cvd, t);
   % Map nodes from CEC tree to execution graph.
   inactive=create_inactive_set (act);
   % Stop searching when inactive procedures are encountered.
   [activeBlk, activeSignal]=reachability (g, start, inactive);
end.

In some implementations, client device 210 may generate a model slice that, when executed, may cause the particular model elements identified in the design interest to exhibit a same behavior as exhibited by the particular model elements during an execution of the model (e.g., the model slice may approximate simulation semantics of the model with respect to the design interest).

In some implementations, client device 210 may determine a set of model transformation rules for generating the model slice. Client device 210 may perform graphical transformations on the model to generate the model slice. In some implementations, the transformation rules may provide analysis for performing coverage-based model slicing. For example, a pre-dependence analysis may include parsing coverage data determined by performing a dynamic analysis of the model and extracting information regarding execution activities of the model elements. The information regarding the execution activities may be used in the dependence analysis of the model. A post-dependence analysis may be performed after the dependence analysis. The post-dependence analysis may be used for transformations involving a Merge block or other model element types. In one example, a merge of different data may rely on functionality that determines which input data affects the output. The post-dependence analysis for the output may account for such functionality.

In some implementations, the transformation rules may incorporate semantic information, such as, for example, model coverage data, into the analysis and/or transformation of the model. Table 1, below, provides example methods that may be used by client device 210 to generate the model slice.

TABLE 1

| Method | Description |
| --- | --- |
| Applicable | Analyze an execution graph connection pattern of an execution graph generated for the model. Determine whether a transformation rule applies based on analyzing the execution graph connection pattern. |
| Analyze | Perform a pre-dependence analysis. Extract activity data from coverage information determined for the model. Determine active and/or inactive model elements based on the coverage information. |
| Post-Transform | Perform a post-dependence analysis. Use dependence information to analyze the model. Determine graphical transformation actions for transforming one or more model elements based on the analysis. |
| Transform | Perform the determined graphical transformation actions on the model to generate the model slice. |

Referring to Table 1, the method Applicable may perform an analysis loop over non-virtual model elements included in the model and may determine whether a transformation rule is applicable with respect to each of the non-virtual elements. When the transformation rule is applicable, the method Applicable may invoke the method Analyze.

The method Analyze may analyze the coverage data and may extract information associated with an execution activity for the model. Applicable model elements may be analyzed based on the transformation rules. The analysis may be local. For example, for a model element that controls an execution of other model elements, the analysis may only return execution activity information associated with execution contexts controlled by the model element. The execution activity information may also propagate to execution contexts that are descendants of the execution context. As an example, assume that a subsystem of the model is determined to be inactive. Each child subsystem within that subsystem may also be determined to be inactive.

The PostTransform method may analyze post-compile virtual model elements, such as, for example, a Merge block, a Concatenate block, etc., included in the model. The post-compile virtual model elements may be model elements that do not have associated execution procedures. The post-compile virtual model elements may define signal buffers that are shared among signal resources of the model elements. Client device 210 may perform a localized analysis using a result of the dependency analysis to determine whether only one of the signal resources of the model element is active. When only one of the signal resources is active, client device 210 may determine that data sharing is not required and may remove the post-compile virtual block from the model. Client device 210 may directly connect the active signal resource and a signal destination of the active signal resource based on removing the post-compile virtual block from the model.

Table 2, below, provides an example set of transformation rules that may be used by client device 210 to perform graphical transformations on the model.

TABLE 2

| Rule | Condition | Transformation |
| --- | --- | --- |
| Inactive-if | A branch of an If block is never taken | Remove a subsystem connected to the inactive branch of the If block |
| Redundant-if | A branch of an If block is always taken | Remove the If block and remove the If port of the subsystem |
| Inactive-switch | A branch of a Switch block is never active | Disconnect the inactive branch of the Switch block |
| Redundant-switch | One input of a Switch block is always taken | Remove the Switch block and connect an input of the Switch block to an output of the Switch block |
| Redundant-merge | One of the data sources of a Merge block is active (post-dependence analysis) | Remove the Merge block and connect an input of the Merge block to an output of the Merge block |
| Inactive-enable | Enable signal is never true | Remove a subsystem associated with the enable port |
| Inactive-trigger | Trigger signal is never active | Remove a subsystem associated with the trigger port |

The following is an example of pseudo-code for performing a pre-dependence analysis:
function [activeBlk, activeSignal]=analyze_execution_activity (mdl, t)
 % Loop over the model hierarchy.
 allActivity=[ ]
 for treeNode=t
  for rule=rules
   if rule.applicable (treeNode)
    % Apply analysis rule
    activity=rule.analyze (treeNode);
    allActivity (end+1)=activity;
   end
  end
 end
 % Remove redundancy, propagate activity in model hierarchy.
 [activeBlk, activeSignal]=postProcess (allActivity);
end.

The following is an example of pseudo-code of a procedure for generating a model slice based on performing a dynamic analysis of the model:
function mdl_slice=coverage_based_slicing (mdl, interests)
 cvd=simulate_and_collect_coverage (mdl);
 rules=create_model_transformation_rules (mdl);
 % Use the rules to analyze block activity.
 act=analyze_activity (mdl, rules, cvd);
 % Analyze model dependence.
 [activeBlk, activeSignal]=analyze_dependence (mdl, act, interests);
 % Transform model to generate model slice.
 mdl_slice=transform (mdl, activeBlk, activeSignal, rules);
end.

The following is an example of pseudo-code for generating a model slice based on performing a formal static analysis of the model:
function mdl_slice=formal_method_based_slicing (mdl, interests)
 ir=create_analysis_ir (mdl);
 rules=create_model_transformation_rules (mdl);
 % Use formal analysis engine to analyze activity.
 act=analyze_activity (mdl, ir);
 % Analyze model dependence.
 [activeBlk, activeSignal]=analyze_dependence (mdl, act, ir);
 % Transform model to generate model slice
 rules=create_model_transformation_rules (mdl)
 mdl_slice=transform (mdl, activeBlk, activeSignal, rules);
end.

The following is an example of pseudo-code for performing a graphical transformation of the model:
function new Mdl=create_slice (mdl, t, inactiveBlks, rules)
 % Preprocess.
 removeSynthesizedBlocks (inactiveBlks);
 toRemove=removeChildren (inactiveBlks);
 % Globally remove dead blocks.
 removeBlocks (toRemove)
 % Perform local graph transformations.
 for the rule=rules
  rule.transform (mdl);
 % Remove the graphical blocks.
 removeRedundantVirtualBlocks (mdl);
end.

In some implementations, the model slice may include all of the model elements included in the group of model elements related to the design interest. For example, client device 210 may identify model elements included in the model that are not included in the group of model elements. Client device 210 may remove the identified model elements from the model to generate the model slice.

In some implementations, the model slice may include a portion of the group of model elements, one or more additional model elements, and/or one or more different model elements. For example, the group of model elements may include a signal block that selectively provides an input to a first portion of the model or a second portion of the model. Client device 210 may determine that only the first portion of the model is not included in the group of model elements related to the design interest. Client device 210 may remove the signal block (e.g., replace the signal block with a signal line for providing the input to the first portion of the model) to generate the model slice based on only the first portion of the model being included in the group of model elements.

In some implementations, client device 210 may store information related to generating the model slice. The stored information may allow client device 210 to re-create the group of model elements related to the design interest, generate a related model slice based on changes to the design interest provided by the user, undo an action taken in response to an input received by a user (e.g., the user inadvertently provides an input to perform an action with respect to generating the model slice and wants to undo it), and/or re-create the original model for the system. Client device 210 may store information identifying one or more actions performed when generating the model slice. The stored information may allow client device 210 to work backwards to undo one or more actions performed when generating the model slice. For example, client device 210 may store information identifying one or more model elements that are modified and/or removed from the group of model elements when generating the model slice.

In some implementations, client device 210 may provide information identifying differences between the model slice and the model. For example, client device 210 may provide a user interface that allows the user to view a list of model elements included in the model and/or a list of model elements included in the model slice. In some implementations, the user interface may display the list of model elements included in the model in conjunction with the list of model elements included in the model slice.

In some implementations, the user interface may list model elements, included in the group of model elements related to the design interest, that have been modified and/or are not included in the model slice and/or one or more additional model elements that are included in the model slice and are not included in the group of model elements and/or the model. For example, when generating the model slice, client device 210 may replace a switch block with a signal line. The user interface may provide a list that identifies the switch block as being included in the group of model elements, as not being included in the model slice, and/or as being replaced by the signal line.

In some implementations, client device 210 may provide information associated with executing and/or verifying the model slice. For example, client device 210 may execute the model slice and may compare a behavior of the particular model elements, in the model slice, during the execution of the model slice with a behavior of the particular model elements during an execution of the model. The information associated with executing and/or verifying the model slice may include information identifying any differences determined by client device 210 based on the comparison. In some implementations, the information associated with executing and/or verifying the model slice may include information identifying a numerical consistency associated with one or more outputs of the particular model elements in the model slice. For example, client device 210 may determine a value of an output of the particular model elements, in the model slice, during an execution of the model slice and may compare the value with a value of the output of the particular model elements during an execution of the model. The information associated with executing and/or verifying the model slice may include information identifying a result of the comparison (e.g., that the values were the same, a difference between the values, etc.).

Additionally, or alternatively to generating the model slice, client device 210 may output a result identifying the group of model elements. In some implementations, client device 210 (e.g., TCE 230) may provide a result that identifies each model element, included in the group of model elements, as being related to the design interest. For example, client device 210 may cause the model to be displayed via a display associated with client device 210. The displayed model may visually distinguish (e.g., highlight) the group of model elements related to the design interest from other model elements included in the model.

In some implementations, client device 210 may visually distinguish the group of model elements related to the design interest by highlighting and/or displaying model elements included in the group of model elements related to the design interest using a color that is different from a color used to display other model elements. Alternatively or additionally, client device 210 may use one or more animated graphical user interface (GUI) features, such as blinking lines, to visually distinguish model elements included in the group of model elements related to the design interest.

The following is an example of pseudo-code for highlighting the group of model elements related to the design interest:

function [gSrc, gDst]=get_graphcial_ports (srcP, dstP)
    % Create an intermediate representation for graph signal connection.
    g=createVirtualPortGraph (dstP);
    [srcV, dstV]=g.reachable (vId(srcP));
    gSrc=handles (srcV);
    gDst=handles (dstV);
end.

Process 400 may include determining a design change for the model (block 406). For example, a user, such as an engineer, may identify one or more modifications for the model based on a result of evaluating the model slice. In some implementations, the user may modify, add, and/or remove one or more model elements included in the model slice to form a modified model slice for implementing the design change. For example, the user may provide one or more inputs for causing one or more model elements, included in the model slice, to be modified and/or replaced. Client device 210 may modify and/or replace the one or more model elements to form the modified model slice.

In some implementations, the modified model slice may modify a behavior of the physical system corresponding to the model (e.g., correct an error, increase an efficiency of the system, etc.). For example, for a particular set of input values, an output of the particular model element may be outside a permissible range of values. The user may identify a model element, included in the model slice, affecting the output of the particular model element. The user may cause client device 210 to modify the identified model element within the model slice to cause the output of the particular model to be within the permissible range of values for the particular set of input values. Client device 210 may modify the identified model element to form the modified model slice.

In some implementations, client device 210 may validate and/or verify the modified model slice. For example, client device 210 may execute the modified model slice based on the particular set of input values. Based on the execution, client device 210 may determine that the modified model slice causes the output of the particular model element to be within the permissible range of values when the particular set of input values are provided to the model slice.

In some implementations, client device 210 may store information related to modifying the identified model element. The stored information may allow client device 210 to revert the model slice back to an original state (e.g., undo the modifications to the model element, replace the modified model element with an original form of the model element, etc.).

Process 400 may include implementing the design change in the model (block 407). For example, upon verifying and/or validating the model slice, a user, such as an engineer, may identify one or more modifications for implementing a design change in the model. In some implementations, the user may modify, add, and/or remove one or more model elements included in the model to implement the design change. For example, the user may provide one or more inputs for causing one or more model elements, included in the model, to be modified and/or replaced. Client device 210 may modify and/or replace the one or more model elements to implement the design change in the model.

In some implementations, client device 210 may replace a model element, included in the model, with a model element, included in the model slice, that was modified to form the modified model slice. Additionally, or alternatively, client device 210 may integrate the modified model slice into the model in another way.

In some implementations, the user may desire to verify and/or validate the modified model (e.g., the model including modified model element(s) from the modified model slice). For example, the user may identify a design interest for verifying and/or validating the modified model. In some implementations, the design interest may identify one or more different model elements, one or more different constraints, and/or one or more different scopes of analysis than included in the design interest used to generate the model slice used to generate the modified model. For example, the user may originally be concerned with improving an efficiency of the physical system and now may desire to verify certain characteristics of the physical system related to the physical system operating safely. In some implementations, client device 210 may receive the design interest and may generate a model slice as described in connection with blocks 402-406. Client device 210 may provide the model slice to the user to allow the user to verify and/or validate the modified model.

While FIG. 4A shows process 400 as including a particular quantity and arrangement of blocks, in some implementations, process 400 may include fewer blocks, additional blocks, or a different arrangement of blocks. Additionally, or alternatively, some of the blocks may be performed in parallel.

III. Context Extraction

In designing, analyzing, and/or testing a computer-generated model of a system, such as an executable graphical or block diagram model, a user may desire to partition the block diagram with respect to one or more model elements, such as a block or a component. Such partitioning may be used to increase scalability of various analysis techniques and/or applications, such as, for example, the Simulink Design Verifier analysis engine from The MathWorks, Inc. of Natick, Mass. The partitioning may also be used for other purposes, such as to isolate a particular portion of the model in order to analyze and/or modify it, to test it within the context of another model, etc. The overall usefulness and results of the partitioning may depend on the methodology used to partition the block diagram model. For example, an algorithmic component that is to be analyzed may be located in or be part of a feedback loop that includes other model elements. Extracting only the component of interest into a new model and analyzing that model may not produce correct results because the analyzed model may not include characteristics of the feedback loop. Similarly, inputs of the component may be algebraically dependent on each other in the original model, and analyzing the component by assuming the independence of the inputs may also not provide a proper representation of the component's behavior.

Partitioning an original model with respect to the given component may include isolating the component in such a way as to derive a contextual model. The derived contextual model may include the given component and an execution context for the given component. In an embodiment, the derived contextual model, when executed, provides an execution behavior for the given component that is similar to the execution behavior of that same component in the original model. The level of similarity may be configured as desired by the user and/or the provider of the embodiment.

The derived contextual model may include a set of dependencies, a data dependency graph, and/or execution dependencies captured from the original block diagram relating to the given component. These dependencies and/or a flow graph may be used to analyze the given component, and may also be used to provide its execution behavior in the derived contextual model.

Figure 4B:
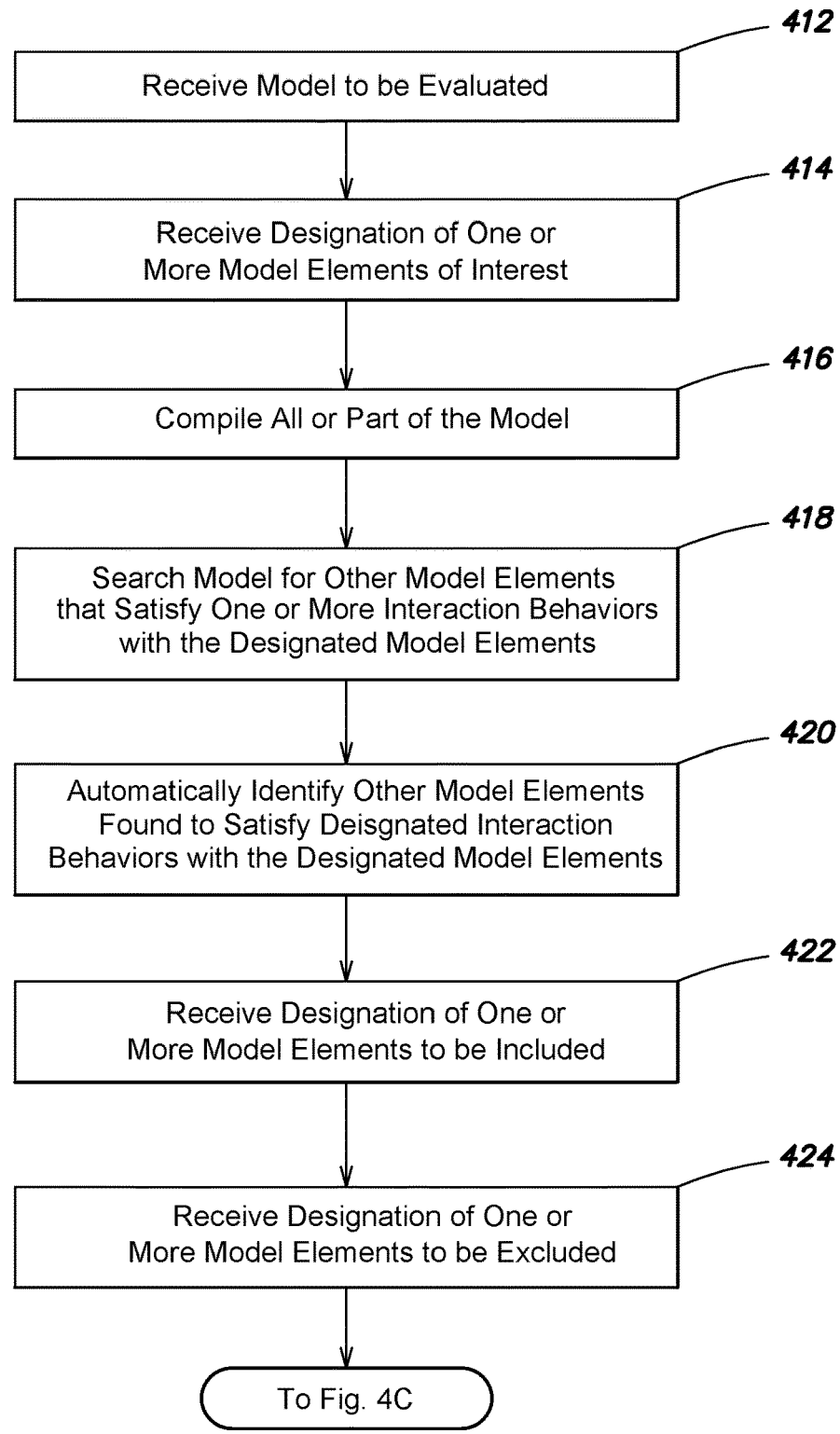
FIGS. 4B and 4C are flow diagrams of an example process for extracting context for a model element of interest.
Figure 4C:
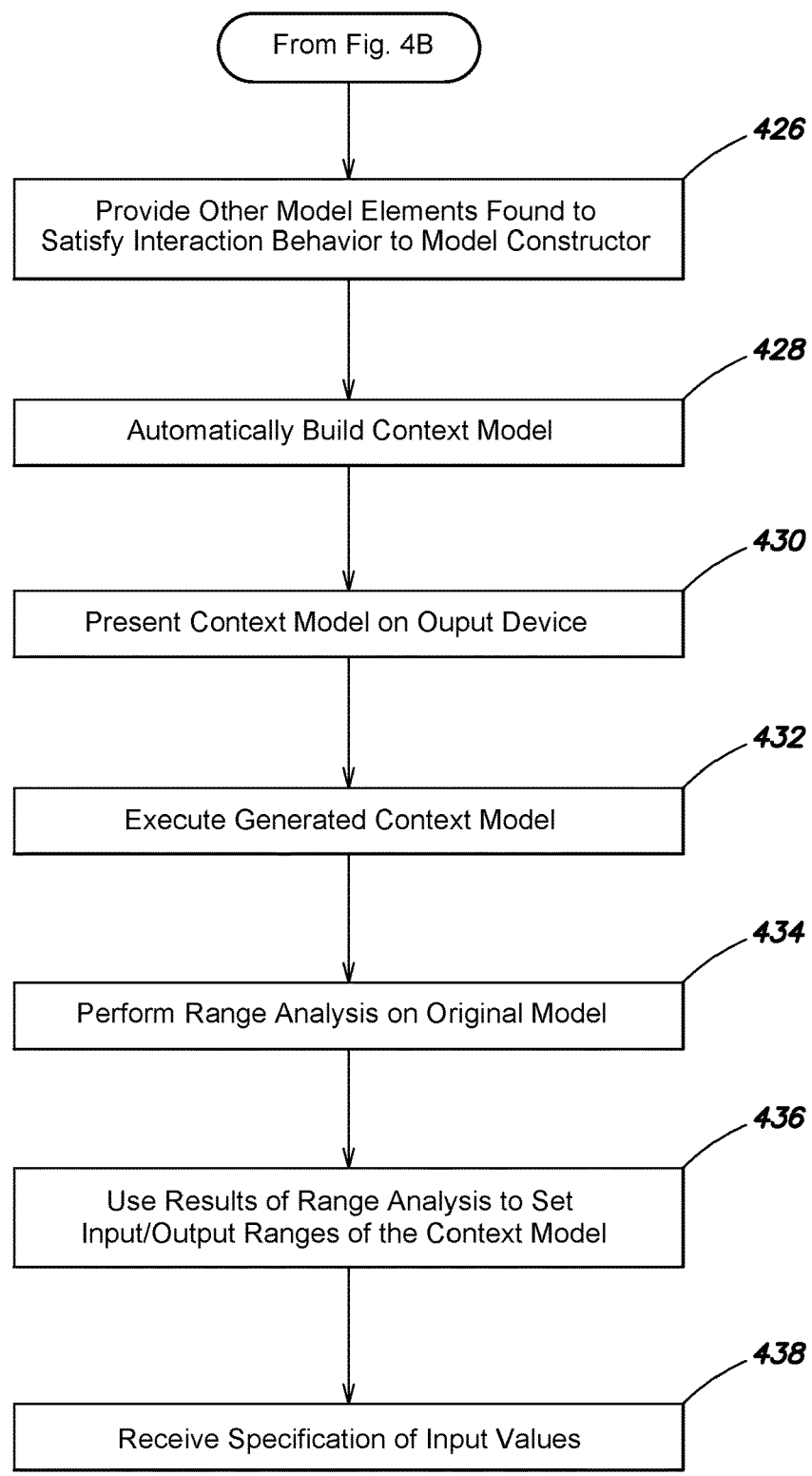

FIGS. 4B-4C are partial views of a flow diagram of exemplary processing. The verification system 214 may receive a model or a portion thereof to be evaluated, as indicated at block 412. The contextual information extraction engine 218 may receive a designation of one or more model elements of interest, as indicated at block 414. For example, a user may be interested in the operation of a particular component, block, statechart or other element of the model. The user may designate this model element through one or more graphical inputs, e.g., using a graphical input device, or by identifying the model element by name through a textual command. The contextual information extraction engine may evaluate the model, including the portion of the model containing the identified model element, to identify other model elements, such as other components, blocks, statecharts, signals, transitions, etc., that would be needed in order to perform a desired analysis of the identified model element. The derived contextual model may contain a minimal set of model elements in such a way that, when executed, time dependent algebraic relationships on the input and output signals of the component, and computed ranges on the input and output interface of the component can be reproduced in an equivalent way, with respect to some characteristics, that they can be observed in the original model or block diagram. Evaluation of the received model and the one or more identified model elements of interest may begin by compiling the model, which may convert the model into an executable form. Specifically, the compiler 202 may compile all or part of the model 400, as indicated at block 416. In addition, the IR builder 212 may build one or more in-memory representations of the model, such as one or more intermediate representations (IRs). The IRs may by in the form of a data, control, call, or data/control/call graph, and include a plurality of nodes, that may represent the blocks and other elements of the model, and edges that represent connections within the model. In an embodiment, the verification system 214 may evaluate the model by examining one or more of the IRs.

The contextual information extraction engine 218 may search the model for one or more other model elements, such as signals, transitions, states, blocks, and components that satisfy one or more interaction behaviors with the identified model element of interest, as indicated at block 418. The contextual information extraction engine 218 may search across hierarchical levels of the model. For example, if the identified model element of interest is located at a first hierarchical level, the contextual information extraction engine 218 may search levels of the model hierarchy above and below the level containing the identified model element of interest. The contextual information extraction engine

218 may identify automatically each model element that is found to satisfy the one or more interaction behaviors, as indicated at block 420. In one embodiment, the contextual information extraction engine 218 may be pre-configured with the one or more interaction behaviors. In another embodiment, an interaction behavior may be defined, e.g., by a user, and provided to the contextual information extraction engine 218.

A first interaction behavior may be a feedback loop behavior. To determine whether other elements of the model satisfy the feedback loop interaction behavior, the contextual information extraction engine 218 may examine one or more IRs generated for the model starting at the identified model element of interest. The contextual information extraction engine 218 may follow the output signals leading from the output port or ports of the identified model element of interest to identify the destination components or blocks of those output signals. For example, the contextual information extraction engine 218 may traverse the edges of the IR that correspond to these output signals, and identify the nodes to which these edges are connected. The contextual information extraction engine 218 may continue to follow the paths of the output signals from the identified model element of interest to determine whether any of these paths lead to an input port of the identified component or block of interest. Such a path that leads from an output port of the model element of interest to one of its input ports may represent a feedback loop within the model. The contextual information extraction engine 218 may mark the signals, blocks, components and other elements along this feedback loop as satisfying the feedback loop interaction behavior.

A second interaction behavior may be an input dependency. For example, an algebraic and/or mathematical relationship may exist among the signals connected to two or more input ports of the identified model element. To determine whether any elements of the model satisfy the input dependency interaction behavior, the contextual information extraction engine 218 may follow the input signals to the identified model element in a reverse direction to identify two or more input signals that have an algebraic or mathematical relationship. For example, the contextual information extraction engine 218 may traverse the edges of the IR corresponding to these input signals, and identify the nodes to which these edges are connected. The contextual information extraction engine 218 may continue to follow the paths past the first nodes. The paths that correspond to two or more input signals to the identified model element may merge, for example, at a junction point, at some upstream location relative to the identified model element. The contextual information extraction engine 218 may determine that such input signals of the identified model element have an algebraic or mathematical relationship. The contextual information extraction engine 218 may mark one or more of the model elements, e.g., all blocks, components, states, transitions, signals, etc. between the input ports of the identified model element and the merge point, and designate these marked model elements as satisfying the input dependency interaction behavior.

A third interaction behavior may be an output execution effect. For example, one or more output signals computed by the identified model element of interest may affect the execution of one or more other elements of the model, such as another block, component, statechart, etc. To determine whether the execution of the identified model element of interest affects the execution of any elements of the source model, the contextual information extraction engine 218 may follow the one or more output signals of the identified model element to identify the model elements that utilize the one or more output signals as their inputs. Such an element may be marked as satisfying the affected execution interaction behavior. In an embodiment, the contextual information extraction engine 218 may identify just the first destination element whose execution is affected by one or more output signals of the identified model element of interest. In another embodiment, the contextual information extraction engine 218 may continue its evaluation of the source model to identify a second, third or subsequent model element whose execution is affected by one or more output signals of the identified model element. The level of evaluation may be specified, e.g., selected by a user, and provided to the contextual information extraction engine 218. Alternatively, the contextual information extraction engine 218 may identify only those model elements whose execution is affected by a plurality of output signals of the identified model element, such as two, three, or more output signals. The particular number of output signals may be specified, and provided to the contextual information extraction engine 218.

A fourth interaction behavior may be an input execution effect. For example, the values for one or more input signals to the identified model element of interest may be affected, for example, computed, by the execution of one or more other elements of the source model. To determine whether an input signal to the identified model element of interest is affected by the execution of another element of the source model, the contextual information extraction engine 218 may following the one or more input signals of the identified model element in a reverse direction to identify the model elements that compute, modify or update the one or more input signals. Such an element may be marked as being affected by execution interaction behavior. In an embodiment, the contextual information extraction engine 218 may identify just the first source element whose execution affects one or more input signals of the identified model element of interest. In another embodiment, the contextual information extraction engine 218 may continue its evaluation of the source model to identify a second, third, or additional model element whose execution affects the one or more input signals of the identified model element. The level of evaluation may be specified, e.g., selected by a user, and provided to the contextual information extraction engine 218. Alternatively, the contextual information extraction engine 218 may identify only those model elements whose execution affects a plurality of input signals to the identified model element, such as two, three, or more input signals. The particular number of input signals may be specified, and provided to the contextual information extraction engine 218.

The one or more interaction behaviors to be utilized by the contextual information extraction engine 218 may be selected by the user. Alternatively, the one or more interaction behaviors may be determined programmatically by the model analysis engine that may leverage the contextual model for the analysis of one or more components of interest. For example, analysis by the Simulink Design Verifier product on a component may require a contextual model where the interactions for feedback loop behavior, input dependency, and input execution effect are captured.

The contextual information extraction engine may perform static range analysis on the model according to user-defined minimum/maximum values for signal and parameter data types and identify ranges on the input/output interface of the component of interest. The contextual information extraction engine may also perform dynamic range analysis on the input/output interface of the component of interest, by simulating the model according to a test suite. Ranges computed from dynamic and static range analysis may be combined and the user specified ranges on the input/output interface of the component in the derived contextual model may be set according to those combined ranges.

In an embodiment, a user may exert at least some control over the creation of a contextual model for the identified model element of interest. For example, the contextual information extraction engine 218 may receive a designation of one or more elements of the model that are to be included in the contextual model being created, as indicated at block 422. For example, a user may designate one or more elements of the model, e.g., graphically with the mouse 118 or textually through the entry of a textual command, that the user specifically wants included in any contextual model to be constructed. The contextual information extraction engine 218 also may receive a designation of one or more model elements that are to be excluded from a contextual model, even though these elements might otherwise satisfy an interaction behavior being applied to the model, as indicated at block 424. For example, a user may designate one or more elements of the model, e.g., with the mouse 118 or through a textual command, that the user specifically wants excluded from any contextual model to be constructed. That is, the user may annotate the model with information identifying model elements to be included and/or excluded from the identification of other model elements.

The model elements identified as satisfying the one or more interaction behaviors may be provided by the contextual information extraction engine 218 to the model constructor 208, as indicated at block 426. The model constructor 208 may build a model, specifically a contextual model, as indicated at block 428. In an embodiment, the contextual model includes only the identified model element of interest, and the other model elements that were identified by the contextual information extraction engine 218 as satisfying the one or more interaction behaviors. These other model elements may be referred to as an execution context for the identified model element of interest. The contextual model built by the model constructor 208 is itself a computer-generated, executable model, such as a block diagram. The model constructor 208 may present the contextual model to the user, e.g., on the display 120, as indicated at block 430. A user may run or execute the contextual model, as indicated at block 432. In an embodiment, range analysis may be performed on the original model, as indicated at block 434. The results of the range analysis operation may be used to set ranges on input and/or output ports of the contextual model, as indicated at block 436.

In addition, or alternatively, the user may specify one or more input values, and evaluate the operation of the contextual model on the specified one or more input values, as indicated at block 438. The user may examine the results produced by the contextual model. For example, the user may add one or more sink blocks, such as a Scope block, to the contextual model in order to visualize one or more results produced by the contextual model during execution. The evaluation of the contextual model may include formal analysis.

In an embodiment, the one or more interaction behaviors utilized by the contextual information extraction engine 218 result in the creation of a contextual model in which the identified model element of interest produces output values that are numerically consistent with the output values produced by the identified component or block of interest as part of the original model. Numerical consistency may refer to the fact that outputs computed by the component of interest in the contextual model and the original model attain equivalent values during execution.

In an embodiment, the model constructor 208 may build the contextual model by partitioning the original model in response to user input, or via any automatic slicing algorithm as described elsewhere herein. In an embodiment, the model constructor 208 may build the contextual model by including the entire original model.

IV. Transforming Slices to Obtain Mutated Slices with Preserved Context

Figure 5:
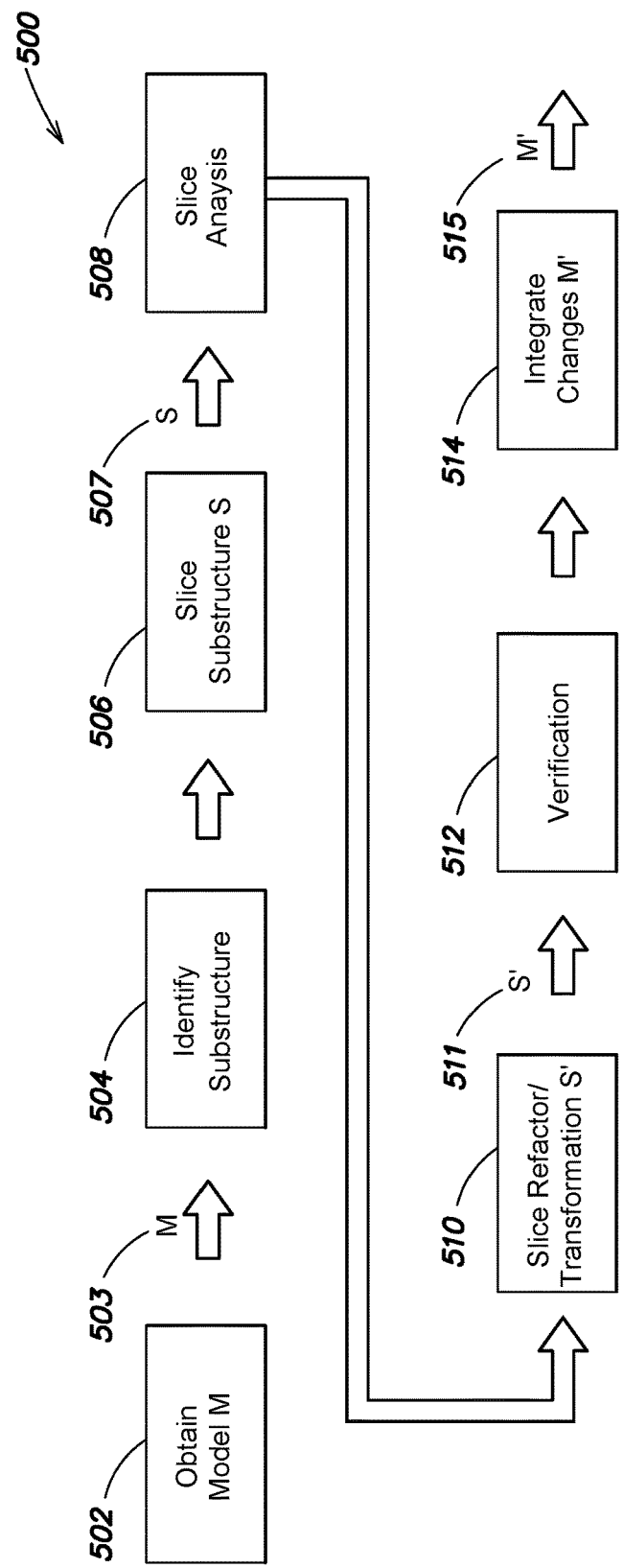
FIG. 5 is a flow chart of an example process for identifying a substructure in an original model, generating a slice from the substructure, and integrating a transformed slice into a mutated model.

FIG. 5 illustrates an example workflow 500 executed within TCE 230 to manipulate a slice of a model. The design interest that constitutes the slice may be a substructure of a certain type. The workflow 500 generally obtains a model 502, identifies one or more substructures 504, slices the substructure(s) 506, analyzes the slice(s) 508, re-factors and/or transforms slices 510, verifies 512 and integrates changes 514.

Act 502 in the workflow 500 is to obtain a specification of a model, M 503. Act 504 is to identify a substructure in the model. For example, the user may be interested in identifying a particular type of structure. An example structure type of interest is an algebraic loop. Identification of substructures may occur by manual input or with automated tools. For example, an automated tool may identify strongly connected components to determine substructures of interest. In other instances, the user may review a visual rendering of functional and/or non-functional blocks of the model. Substructures of interest may then be identified visually on the rendering via a user interface.

One example type of structure of interest may be a loop that contains no integration or delay steps. Such loops may include an algebraic loop. These loops may be of interest because they may slow down the simulation results. They may also be undesirable in some situations because they were accidentally introduced into the model. As a result, the user may want to identify them and then do something about them, such as removing or replacing them in the model.

Other example loop structures of interest include control loops. A control loop is a type of loop where a value is measured and compared to some other value, and then a control action is taken based upon the results of the comparison. Control actions may include, for example, whether or not to take a branch, or activate another part of the model. In a simple example, the user may want to know how many control loops are in the model. In another example, the user may want to discover certain types of control loops and replace them or remove them from the model.

Two other example structures of interest include feedforward paths and positive feedback loops. Such structures may cause an instability in the simulation results. The presence of these structures may be discovered when the user observes a self-excitation during a simulation of the model. The user may find it preferable that such feedforward or positive feedback structures are discovered and replaced before submitting the model to a simulation.

Still other types of structures may be of interest. For example, in simulating a network of components, the designer might be interested in the longest or shortest path between two points. These connection paths might be of interest as potentially impacting the overall system delay. Or the user may also be interested in other connection-related structures such as the existence of multiple parallel paths. The discovery of parallel paths may assist with more efficient realization of the model. In one scenario, the designer may want to take advantage of implicit parallelism in the design and refine the connection paths or the block layout. In other instances, the identification of parallel paths may be used to assist with speeding up solvers and/or speeding up simulations.

In yet another instance, a slice may contain a discrete time representation such as feedback loop for which the user may wish to perform certain types of analysis such as a stability analysis. In this instance, the sliced model may also assist with automated mapping between continuous time and multi-rate discrete time implementations to further assist with such analysis.

For example, a final control law implementation might contain discrete-time components with different sample times. By slicing by sample rate, the user can then apply the transform act 510 to multiple slice(s) S in different ways. In some examples the transform step may:

- map discrete time slice(s) to an equivalent continuous time implementation so that standard gain, phase and other stability measures can be determined; or
- transform each of the slices to a sample time that is a fastest sample time among all slices, and then use discrete-time stability measures; or
- apply lifting theory to lifting faster sampling rates to a slower rate resulting in a set of slices all with the same sample time.

The stability analysis may then be done on the resulting mutated model M' with a control part that is expressed in continuous time. In such an instance, the control part then also gets converted to a corresponding discrete time representation (which sometimes may be multi-rate). Slicing is thus a way to help with the model management part, with some other aspect of the technical computing environment (such as MATLAB) supporting manipulation of the mutated slices S' to perform control-based analysis.

More particularly, a slice S' may be defined with a different sampling rate than a sampling rate associated with some other part of the model. The resulting two or more slices may thus be defined by having different sampling rates. Slicing by sample rate may then permit the application of known norm-based stability measures for a multi-rate system. Such norm-based analysis of the slices may consider how sinusoidal signals propagate through the substructure of interest. One example norm might be the H-infinity norm that can determine what the maximum energy transmission is through the slices, for all possible sinusoidal disturbances.

In another instance, a component of a discrete-sample rate slice or multiple slices may be mapped back to continuous time, so that a continuous time stability analysis is possible on mutated model, M' (and/or mutated slices S'). A control-based stability analysis such as lifting theory may also be of assistance in stability analysis where the slice(s) are each a discrete time representation and linear, but have different sample rates. Usually, to apply norm-based analysis, the whole model is represented with a single sample time. Lifting theory permits application of norm-based analysis to a discrete-time system with more than one sample rate, provided the different sample rates are common multiples of the fastest rate. "Lifting" a lower rate slice of the model involves adding extra inputs and outputs to represent the inter-sample time data. For example, lifting a 20 Hz 1-input component to 10 Hz results in a 2-input, 2-output equivalent 10 Hz component. The 10 Hz component may then be concatenated with other 10 Hz components and submitted to norm-based analysis.

Identification of other types of structures, such as those that have no dynamics, can also help with model optimization. For example, a representation of an electrical circuit containing operational amplifiers may consist of a series of gain blocks. It may be possible to replace the multiple gain blocks with a single gain block. In another instance, a function may be identified as providing a sequential input to another function. In that instance, it may be possible to merge the two functions.

Thus more generally, analysis can determine that the slice S contains multiple linear blocks, that can be converted to a single state space in the mutated slice, S'. Known state space order reduction techniques can for example be used to remove differential states that only provide a small contribution to the input-output behavior. This can lead to simulation performance improvements with minimal loss in accuracy.

Also, a linear parameter varying (LPV) state space may be used to define mutated slice S', as a way to simplify the model M, and/or as an equivalent implementation if the original model is LPV. Thus a non-linear slice from the original model may be approximated by an LPV slice S' in the mutated model M'. Such a mutated model M' may then be submitted to a norm-based stability analysis. Any suitable known approach for determining an LPV equivalent can be used.

This technique may be useful where slice S may not be well approximated by a single linear model, but can be approximated by a set of linear models that depend on some parameter. Replacing a slice S with an LPV equivalent in the mutated model M' may improve performance in subsequent simulation as a result of removing complex non-linear equations and replacing them with a simpler LPV equivalent. This approach can also be used for control system norm-based analysis and synthesis.

In act 504, through various forms of automated, manual, or visual analysis, certain substructures (such as elements, structures, or patterns) or groups of substructures of interest in model M may be identified. These can be either syntactic or semantic. For example, a substructure, or "slice," of interest may be identified by the user interacting with a graphical depiction of the original model M. The user may identify model components that belong to a function. The slice S may also be identified by manually tagging, naming, labelling, applying a color to components of the visual display. In another example, a part of model M that was imported from another tool may be automatically tagged. In yet another example, substructures of a certain type may be automatically identified using the slicing algorithms described above.

In act 506, the substructure of interest is "cut out" or "sliced" from the model. In act 506 while the substructure is sliced from the original model, M 503, the specification for the slice, S 507, preserves some aspect of the original context of the original model M 503 from which the slice S was taken. For example, the preferred context may include maintaining an initial state value and/or inputs to slice S. The preserved context may or may not be time-based. The context may also be identified based on a design interest, or on a spatial, temporal, or range of variables associated with the particular substructure. The preserved context may also include constraints on input signals, on other ranges of variables or other aspects of the identified slice S.

As explained above, the model M may include a graphical or some other representation of one or more physical elements or attributes of interest in slice S. For example, the user may wish to preserve the layout in the original model M to some extent in slice S, but may still conduct further analysis of the layout in slice S (e.g., using automatic graph layout algorithms). Moreover, the user may add further aspects of the layout (including virtual model elements) specific to the model slice (e.g., by introducing a hierarchy with virtual subsystems). This layout information may be stored with the model slice S, and may not necessarily be propagated to the original model M depending on user preferences. The layout information may also be retained in some instances, such as when the model slice S is updated based on changes to the current model M.

In act 508, the slice S is analyzed using the preserved context. Act 508 may also involve considering the type of substructure and determine, for example, other inputs or aspects beyond the specified context that may make the slice, S, functional as a stand-alone model of the identified subcomponent.

In one example, the preserved context in act 506 might also include semantic elements for a subsequent dynamic analysis as part of act 508. For example, slice S of model M can be identified based on its spatial or temporal characteristics, and the user may determine a set of constraints or variable restrictions to be applied to various signals or inputs to a dynamic simulation of slice S.

In another example, the preserved context may include more than just the state of the individual components of slice S. For example, the preserved context may include attributes of the chosen simulation (such as step size, sample rate, differential equation solver, algebraic loop solver settings, rate transition settings, zero-crossing settings, model configuration parameters, etc.) or a history of prior simulation results. The preserved context may also include aspects of chosen solvers. In one example, a higher order solver may extrapolate from a previous simulation step and the preserved context may accommodate that. In another example, algebraic solutions from a previous step may be used to initialize a new algebraic or other solution.

The preserved context may include information so that the mutated slice S' is equivalent or substantially equivalent to the slice S in some way. For example, the mutated slice S' may produce a response and/or behavior that corresponds in some way to the response and/or behavior of the slice S. For example, the mutated slice S' may produce a behavior that is numerically the same within a tolerance, behavior that is the same for an interval in time (e.g., an initial value or initial interval, a time window, etc.), behavior that includes the same event sequence (e.g., a total order or partial order), behavior that has the same features (e.g., steady state behavior, phase behavior, frequency behavior), behavior that as the same qualitative characteristics (e.g., the same value ranges, transitions between value ranges), and/or behavior that satisfies the same analyses (e.g., tests, assumptions, evaluations) that may be encoded in a computational form (e.g., a script, a function, a method, a model).

In act 510, the user may re-factor or transform (e.g., minimize or simplify) the slice S. For example, an algebraic loop structure may be replaced with an equation model, or another structure might be "memorized" by replacing it with a lookup table. In this act, some transformation is performed on the original slice to obtain a mutated slice, S' 511.

Transformation of the slice may also involve modifying the slice in some way. Once example is opening up a feedback loop. In example implementations, a user may indicate where the feedback loop should be cut, or the location of the cut may be automatically determined (e.g., when a rate transition takes place). The locations of the cutout may be used to indicate input and output of the loop. The input and output may then become part of the context, or a reference connection may be made from output to input such that the loop functionality is maintained, yet the transformed slice shows a linear path.

In act 512, the mutated slice S' 511 may optionally replace the originally identified slice S in a copy of the original model. This transformed or "mutated" model, M', is then compared against the original model M in act 514. Act 514 may incorporate verified changes if desired.

While FIG. 5 shows workflow 500 as including a particular quantity and arrangement of acts, in some implementations, process 500 may include fewer acts, additional acts, or a different arrangement of acts. Additionally, or alternatively, some of the acts may be performed in parallel.

Figure 6:
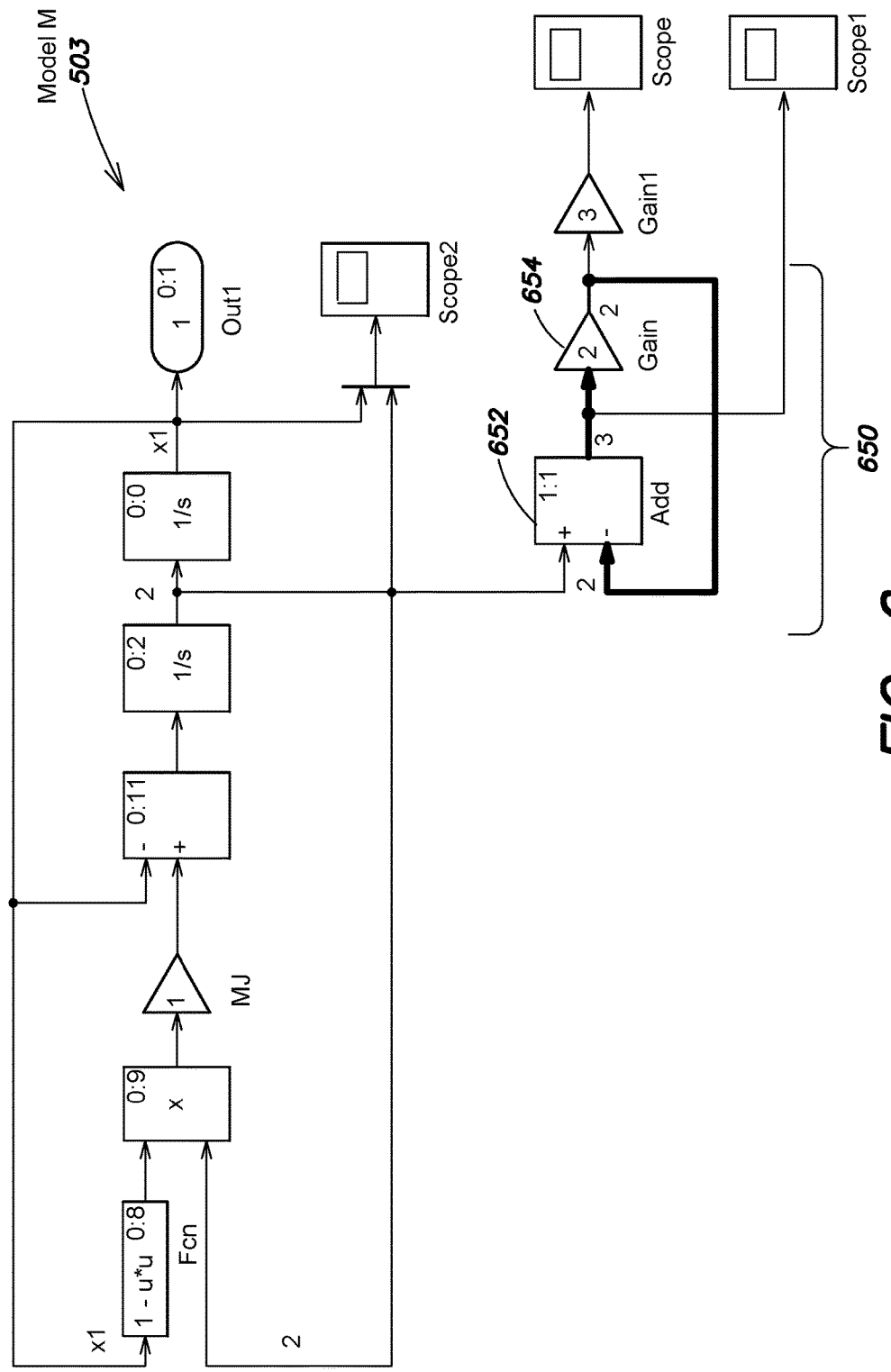
FIG. 6 is a diagram of an example substructure.

FIG. 6 shows a visual rendering of an example model, M 503. The analysis has determined that the model contains a particular substructure of interest, in the example here the highlighted algebraic loop 650. In this example, the algebraic loop 650 was identified by an automated process, but the algebraic loop 650 (or more generally, 'the substructure') could also be highlighted manually on a visual or graphical rendering of the model, M. The substructure can also be output in a textual form, such as an XML file or provided for display. The example substructure here, algebraic loop 650, consists of an add block 652 followed by a gain block 654 whose output is fed back as negative input to add block 652.

Figure 7:
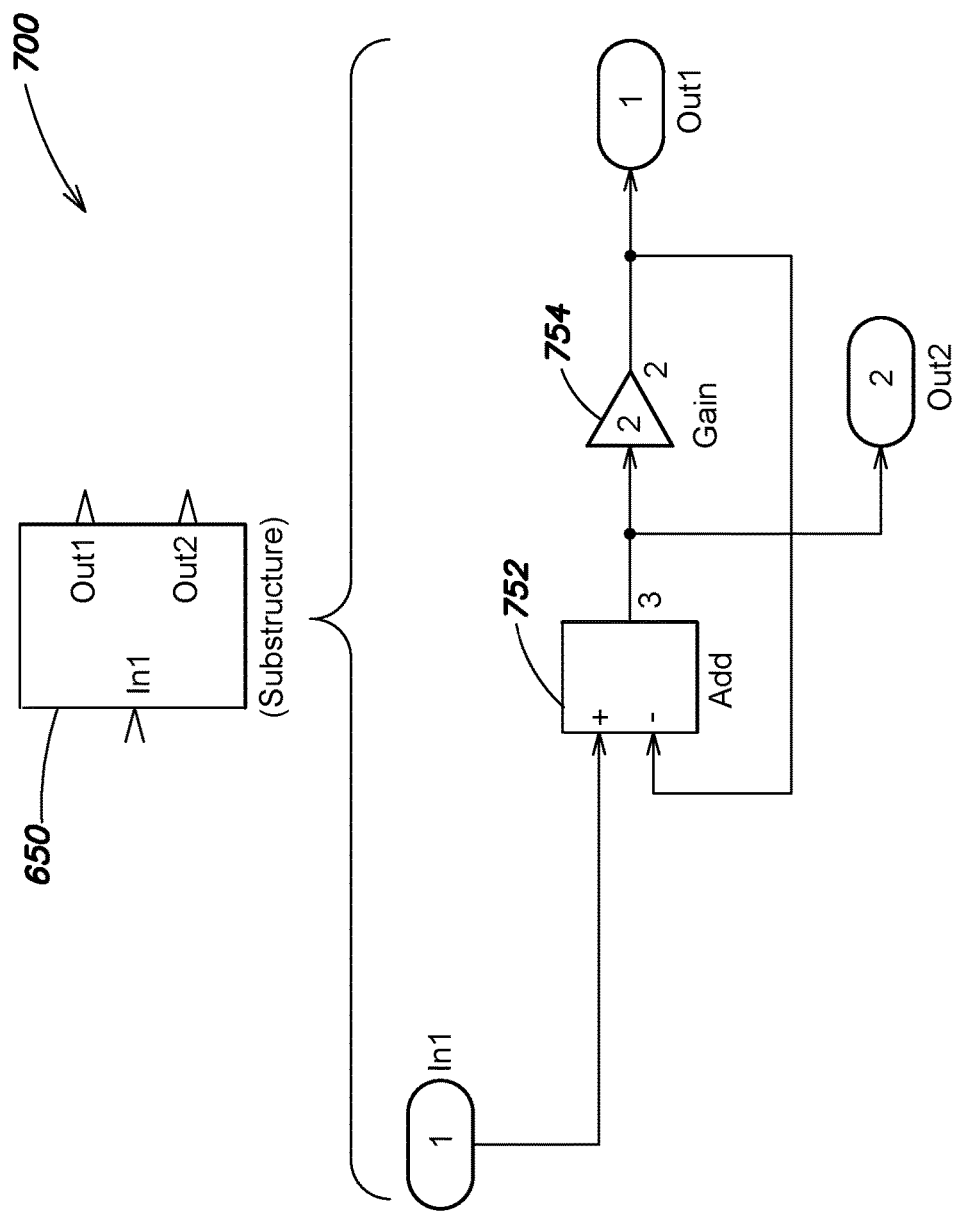
FIG. 7 shows an algebraic loop substructure being sliced.

FIG. 7 shows the results of slicing act 506 for the example of FIG. 6. The algebraic loop 650 substructure is copied from model M to a new model slice 700 that only contains the "sliced" components of the algebraic loop 650 including an adder 752 and a gain block 754 that correspond to adder 652 and gain block 654 in the original model M.

Figure 8:
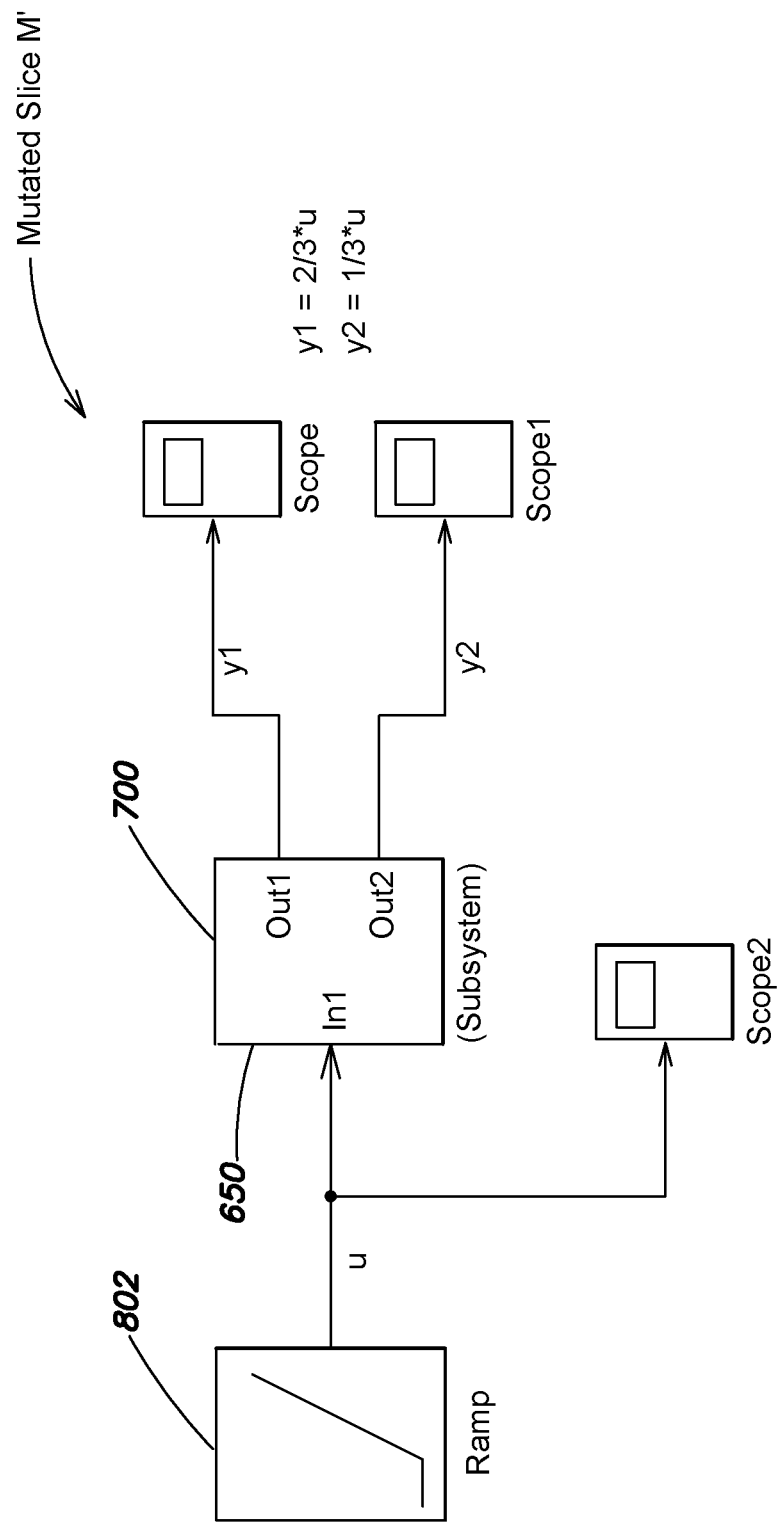
FIG. 8 illustrates a modified slice for the algebraic loop.

As shown in FIG. 8, the model slice 700 is then analyzed and simplified in act 508. In this example, the model slice 700 is submitted to a simulation that applied a ramp signal 802 to input In1, and scopes (scope, scope1, scope2) are placed on In1, Out1 and Out2. In this example, the simulation of the model slice 700 is submitted to a solver or some other process that may determine some other way to represent the original slice, S. The simulation result may be included as part of the preserved context for slice S.

In one example, the system may determine certain blocks are not needed to accurately represent slice S, such as if intervening blocks become disabled when slice S is cut out of the model M. Information as to why model elements were not included in slice S may also be presented to the user.

In the example of FIG. 8, the analysis at act 508 determines that the model slice 700 may be represented by a regression (analytical) model to represent the mutated slice S' as follows:

$$Out1 = \tfrac{2}{3}(In1)$$

$$Out2 = \tfrac{1}{3}(In1)$$

In another instance, analysis at act 508 may determine slice S can be represented in other ways. Analysis of the slice S may include dynamic analysis, formal static analysis, dynamic analysis followed by formal static analysis, or formal static analysis followed by dynamic analysis. These analyses may proceed in parallel. More generally, the ordering of different analyses may allow using the results of one analysis as input to another.

More generally, the mutated slice S' output from transform act 510 may represent original slice S using memorization, lookup table(s), a closed form function call, local solver, numeric integration solver, linear solver, non-linear solver, a zero crossing model or some other function.

It should be understood that multiple slices $S_1, S_2, \ldots S_n$, in original model M may also generate corresponding mutated slices $S'_1, S'_2, S'_3, \ldots$, for mutated model M'.

The mutated slice S' may include a discretized model of original slice S. For example, the mutated slice S' may have a different sampling rate than, or a linearized equivalent to, original slice S.

Figure 9:
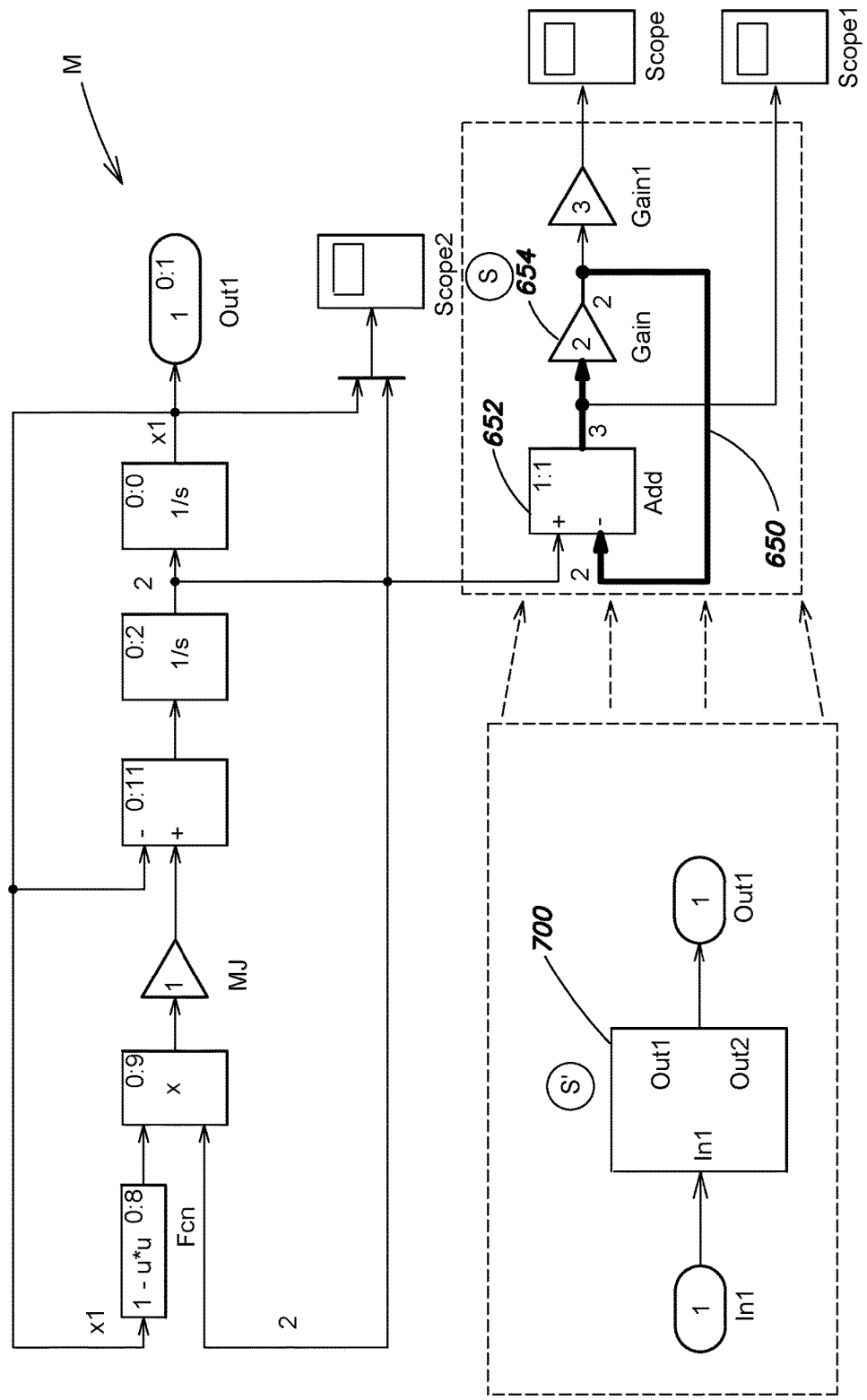
FIG. 9 shows an online simulation of the mutated model.

As shown in FIG. 9, the mutated slice S' may then be used instead of S and optionally integrated back with the original model M to provide a mutated model M'. The mutated model M' can then be submitted to further simulation to verify the replaced substructure. In one example, the further simulation may apply static analysis. In other example, this further simulation might include dynamic analysis, or some combination of static and dynamic analysis as explained above.

Returning to consider act 512, a simulation output of the mutated model M' may then be compared to a simulation output of the original model M. In some implementations, this simulation can proceed on-line. The substructure may be verified (act 512 of FIG. 5) via an in place simulation. That is, verification of the original model M with the simplified structure S' may occur prior to generating the mutated model M'. Simulation may take place as a foreground or background process, for example, with the candidate M' simulated in a foreground process and M in the background. This may lead to more rapid identification of problems with verification of the mutated slice S'. This simulation may also be used to obtain a range of input signals that are valid for the mutated slice S', for example, where the substructure of interest in the original model M is replaced with a lookup table or analytic expression.

FIG. 9 also illustrates that a transformed structure can be replaced by a simplified diagram that depends on the transformation used. In some examples, the transformed structure may be connected to blocks in the mutated model M' via a reference mechanism (e.g., "from" and "go-to" blocks that establish relations by means of matching labels), or as a lookup table, or as an analytic expression solver. The transformed slice S' may be visually distinguished in this view. In an instance where the model includes code, the code structure of interest may be visually distinguished.

Figure 10:
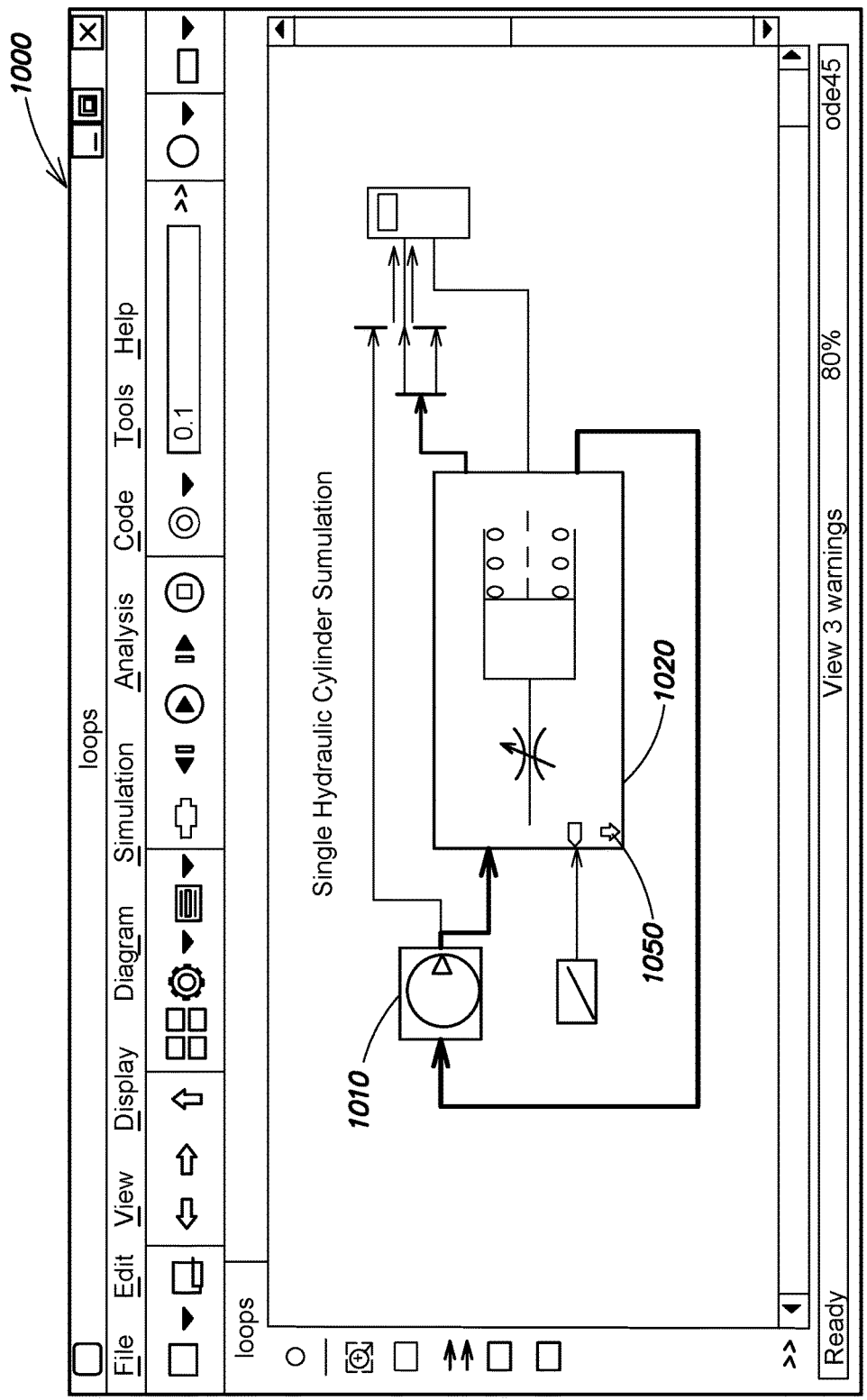
FIG. 10 is an example model of a hydraulic cylinder.
Figure 11A:
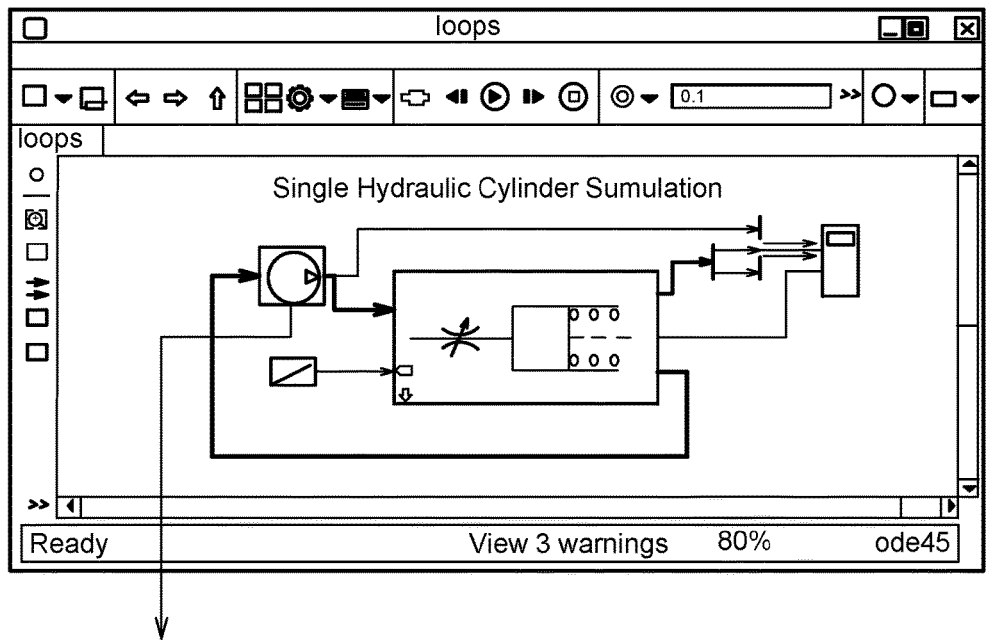
FIGS. 11A-11D show the hydraulic cylinder model hierarchy.
Figure 11B:
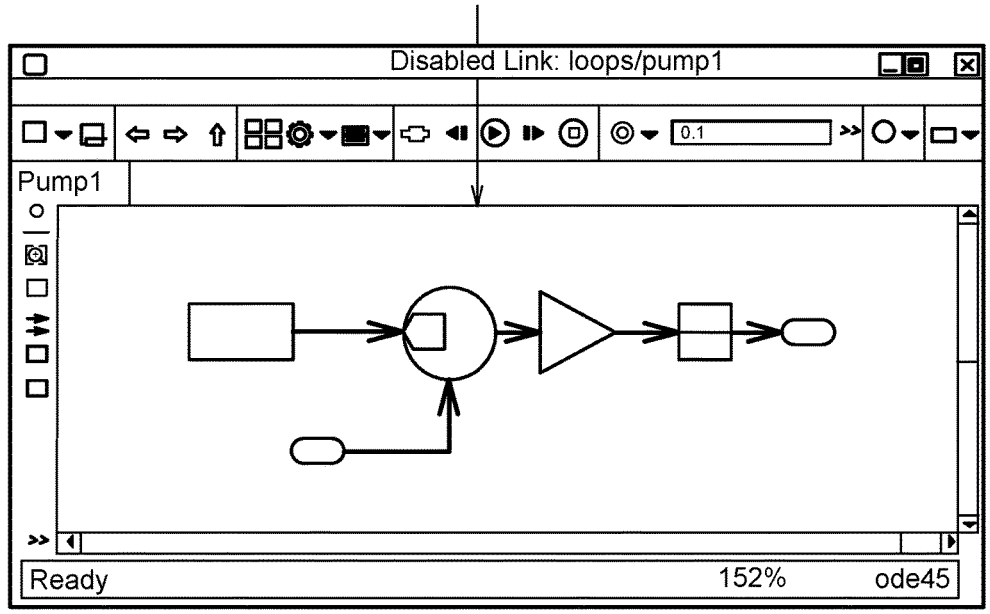
Figure 11C:
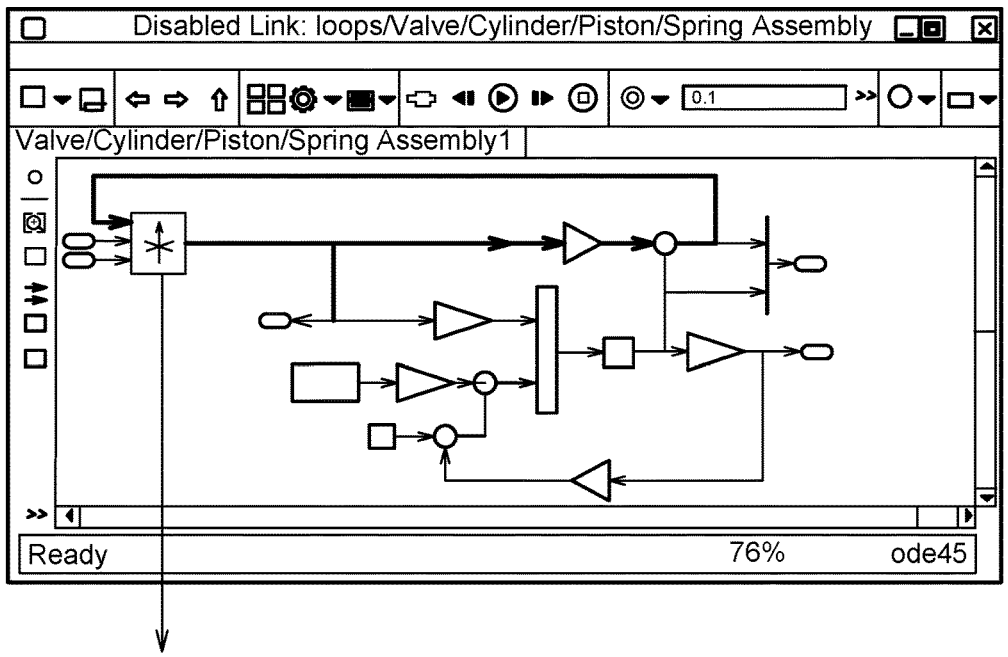
Figure 11D:
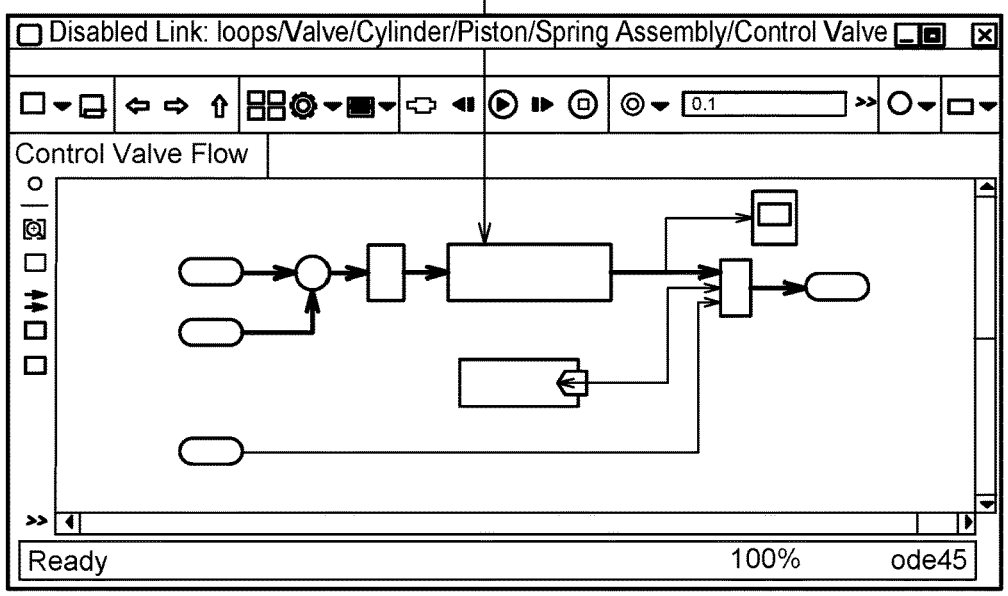

FIG. 10 is another example model M that contains a more complicated structure of interest. This example model is a hierarchical model 1000 of a system including a hydraulic cylinder 1020 and a pump 1010. The hierarchical model 1000 of the hydraulic cylinder is further shown in FIGS. 11A-11D. For example, the hydraulic cylinder may consist of a valve, a cylinder, a piston, a spring, and a subassembly. The subassembly may in turn consist of a control valve shown in more detail in FIG. 11D. In a user interface, the designer can click on various parts of the hierarchical model 1000 and view the details at different levels of the hierarchy. An algebraic loop of interest may be subsumed within a view of the model such as a view of the top level of the hierarchy shown in FIG. 11A. But the user may also be concerned with substructures of interest at lower levels in the hierarchy, such as the algebraic loop shown at the lowest level view in FIG. 11D. Debugging such hierarchical models 1000 may be difficult if the user merely clicks through various levels of the hierarchy in FIGS. 11A-11D to determine substructures of interest such as algebraic loops.

Figure 12A:
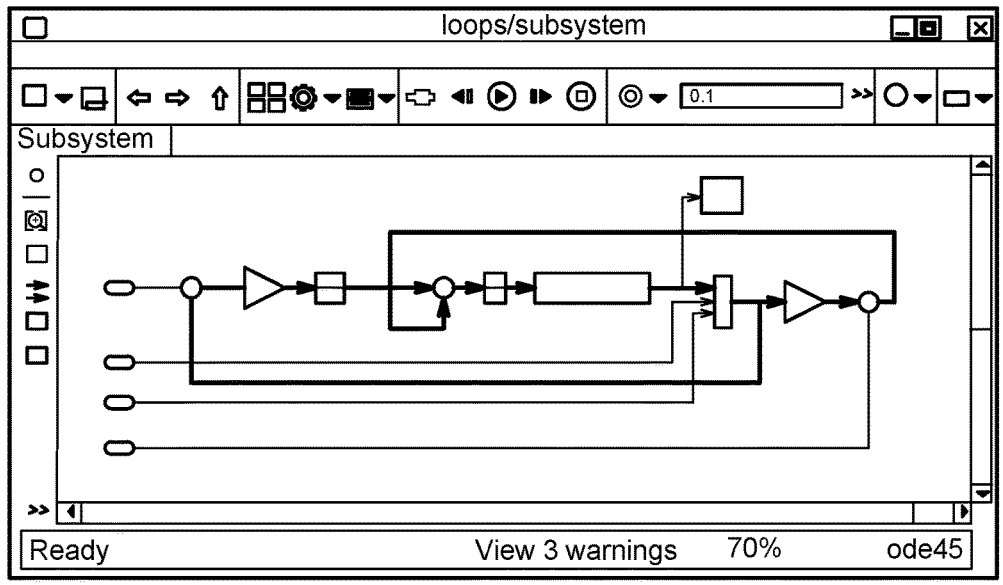
FIGS. 12A-12C show a flattened model of the hydraulic cylinder and scope.
Figure 12B:
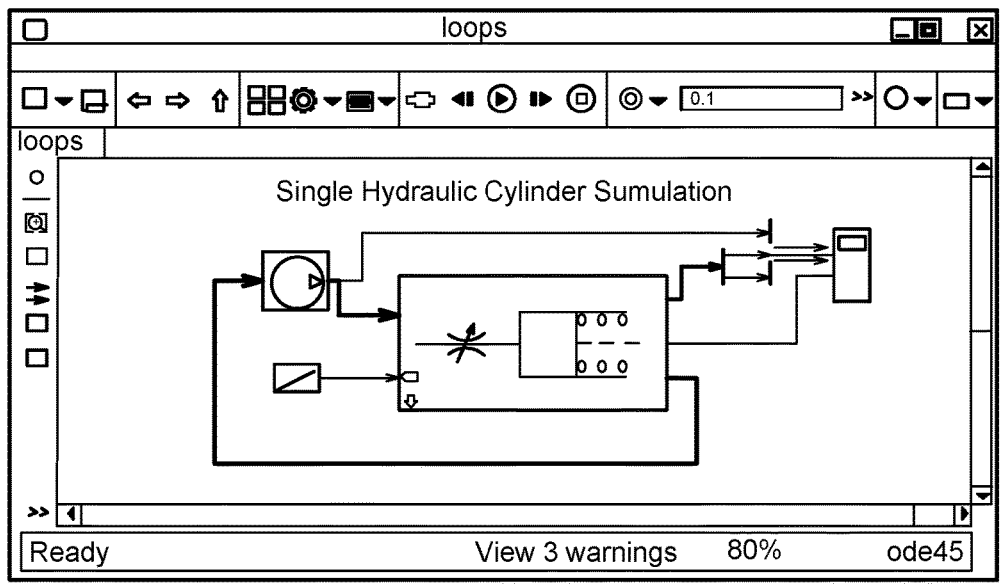
Figure 12C:
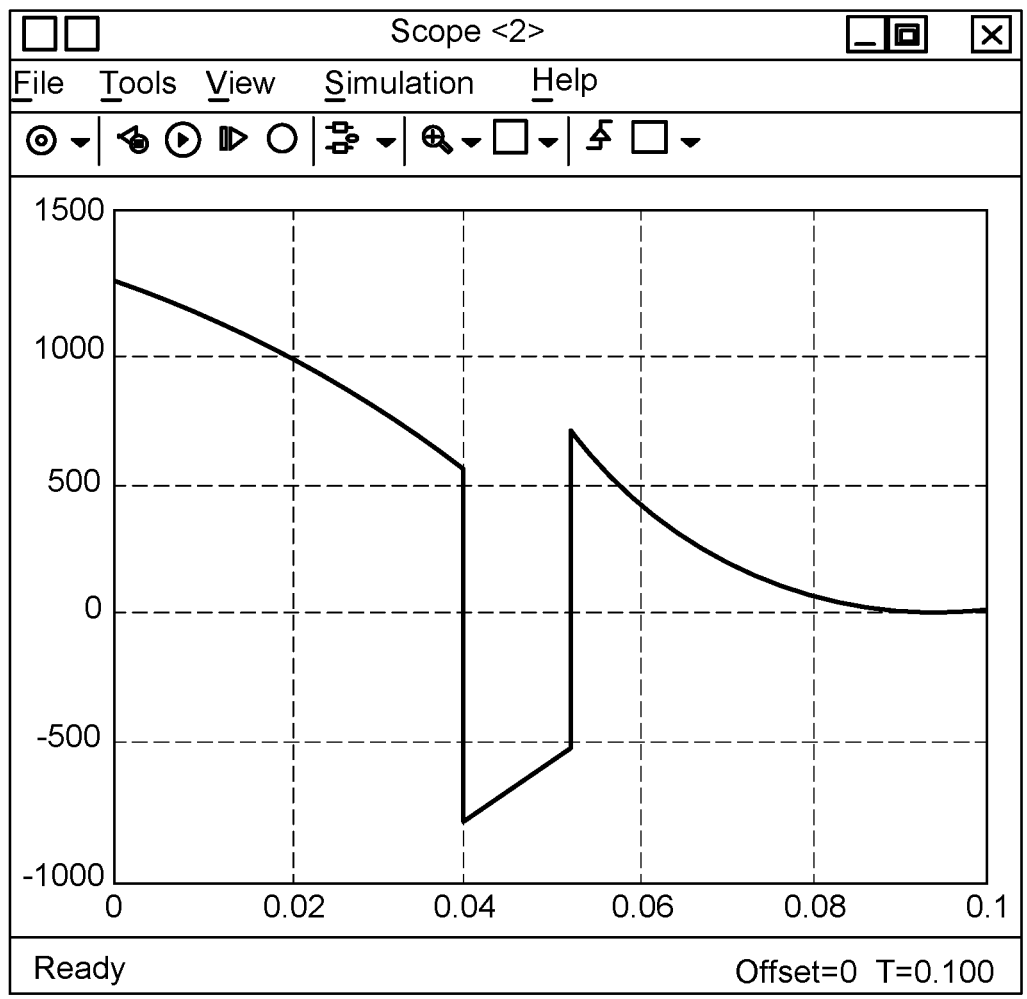

A "flattened" hierarchy may be presented to the user, showing two or more levels of the hierarchy in a single view such as in FIGS. 12A-12B. Such an illustration of the flattened model may assist the user in finding the substructures of interest. The substructures of interest may then be isolated. The isolated substructures may then be sliced from the model and analyzed as a separate subsystem in the manner explained previously (such as a scope block of in FIG. 12C). As such, act 504 of isolating the slice, and/or act 510 of transforming the structure (FIG. 5) can thus also be considered to include flattening the model hierarchy. Such flattening of the model may also include context preservation including preservation of local work spaces as part of analysis act 508 or transformation act 510.

In some implementations, the mutated slice S' may be placed in a higher level of the hierarchy than the level where the original slice S of interest was located. For example, a mutated slice S' representing the turbulent flow for control valve slice S' of FIG. 11D may be placed in the level shown in FIG. 11C in the mutated model M'.

Figure 13:
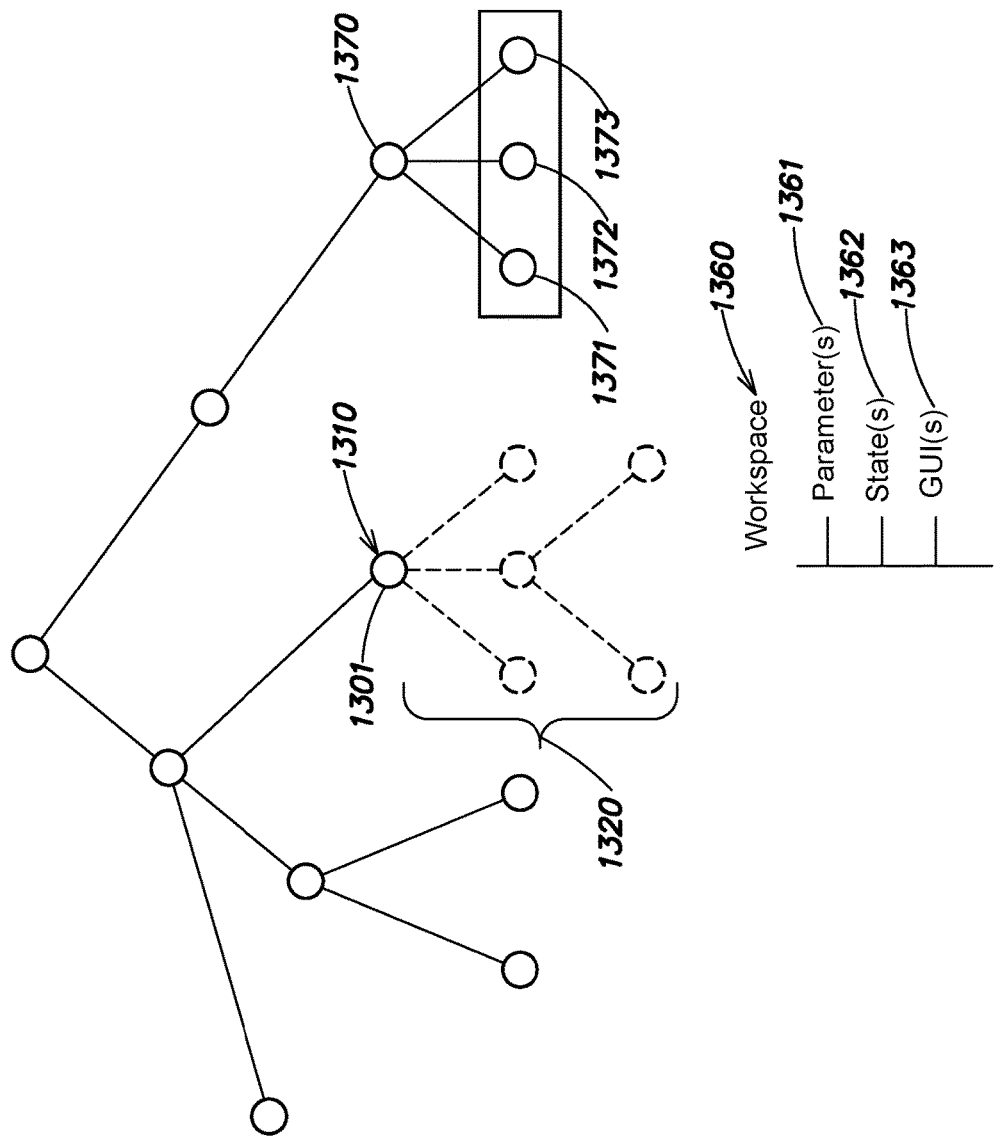
FIG. 13 is another example hierarchical model.

A conceptually hierarchical model M may be graphically represented as a tree structure, one example of which is shown in FIG. 13. Components and other elements of such a model M may be represented as nodes in the tree structure. Nodes without children are called leaf nodes, and a node with no superior node is called a root node. A model hierarchy may be visually presented to the user as part of substructure identification (504), slicing (505), analysis (506), transformation (510) or verification (512) or at other times.

A first node 1301 may represent a masked subsystem 1310 of interest. A detailed hierarchy 1320 of the masked subsystem 1310 may be hidden from the user by default. A level of detail of the masked subsystem 1310 may be presented to the user, for example, based on an input. Thus node 1301 appears as a leaf node in model M but the user can expose its hierarchy. In one implementation, this may be initiated by the user (see FIG. 10) clicking on an icon 1050 associated with a graphical view of the component 1000. Alternatively, or additionally, different levels of hierarchy may be presented based on other inputs, such as property settings and/or other user inputs.

The masked subsystem 1310 may also make use of one or more local workspace(s) 1360, including parameters, states, or interfaces. In such an instance, workspace 1362 or interface 1363 may become part of the preserved context and mapped to corresponding aspects of the slice S. The slice S may create a workspace, parameter, state or interface that preserves some or all aspects of the masked component 1310. In a first scenario the user does not expose or interact with the hierarchy 1320 of the masked component 1310, and the masked subsystem workspace 1360 is retained in its entirety as a workspace associated with an unbreakable element of the slice S. In another scenario, the user does expose the detailed hierarchy 1320 of the masked subsystem 1310, and selects only a portion. This selection may be manual, or it may be via the automated slicing algorithm(s) discussed above. In the case of an automated slicing algorithm, the user may indicate that a slice may select portions of a masked subsystem and the slicing algorithm may then make the selection. The user may also indicate that a masked subsystem should be preserved, in which case it will be treated as a leaf or primitive node by the slicing algorithm. In that instance, the system may preserve only some, or add new aspects to workspace 1360 in the preserved context so that the parameters 1301, states 1302, and/or interfaces 1303 operate as they did in the original model M.

In another example, the hierarchical model M may include one or more virtual subsystems 1370. Here the virtual subsystem 1370 is replaced in its entirety during simulation with its constituent components (1371, 1372, 1373). But if it is an atomic subsystem, the constituent components are kept together as a single unit. Virtual subsystems 1370 may be purely graphical (having no semantics). Non-virtual subsystems may specify semantics (on-off enabled, triggered, function called, atomic, etc.), and any of those may be masked.

Figure 14:
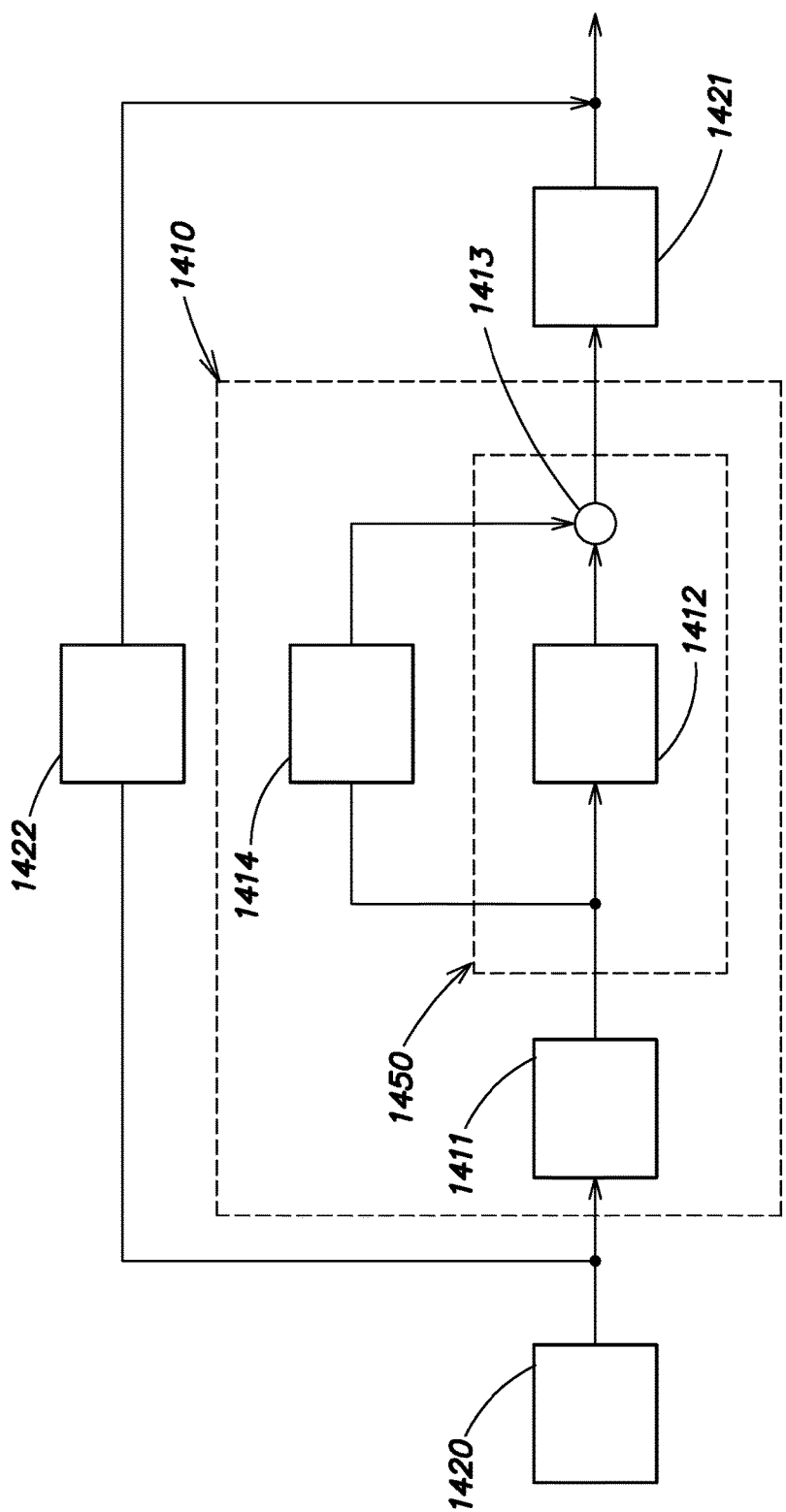
FIG. 14 is a graphical view of a slice.

FIG. 14 illustrates a graphical view of an example slice 1410 that includes components 1411, 1412, 1413, 1414. The slice has been "cut out" of a larger model M. The slice 1410 may have been connected to other component(s) of model M, such as components 1420 on an input side of slice 1410, components 1421 on an output side 1421, or components 1422 on a feed forward/feedback path. These other connection components may typically not be visible in this view at all, or may be shown shaded or otherwise visually distinguished. If these components outside of slice 1410 are visible, multiple components may be represented by a single block for context, but in a way that the user can still focus on manipulation of slice 1410 separated from model M. The view of FIG. 14 thus may preserve context for some or all components, states, connections, and/or attributes of model M around slice 1410.

When the user simulates the extracted slice 1410 with its preserved context, the connected/surrounding blocks 1420, 1421, 1422 may also be submitted so that the simulation of slice 1410 is accurate—but still the user may only observe the behavior of the components of slice 1410 which is the actual substructure of interest.

Figure 15A:
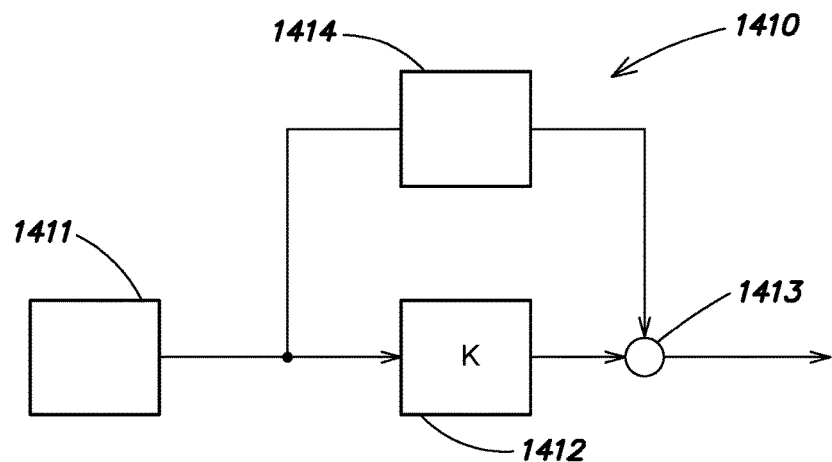
FIGS. 15A and 15B are views of two slices taken from the same model.
Figure 15B:
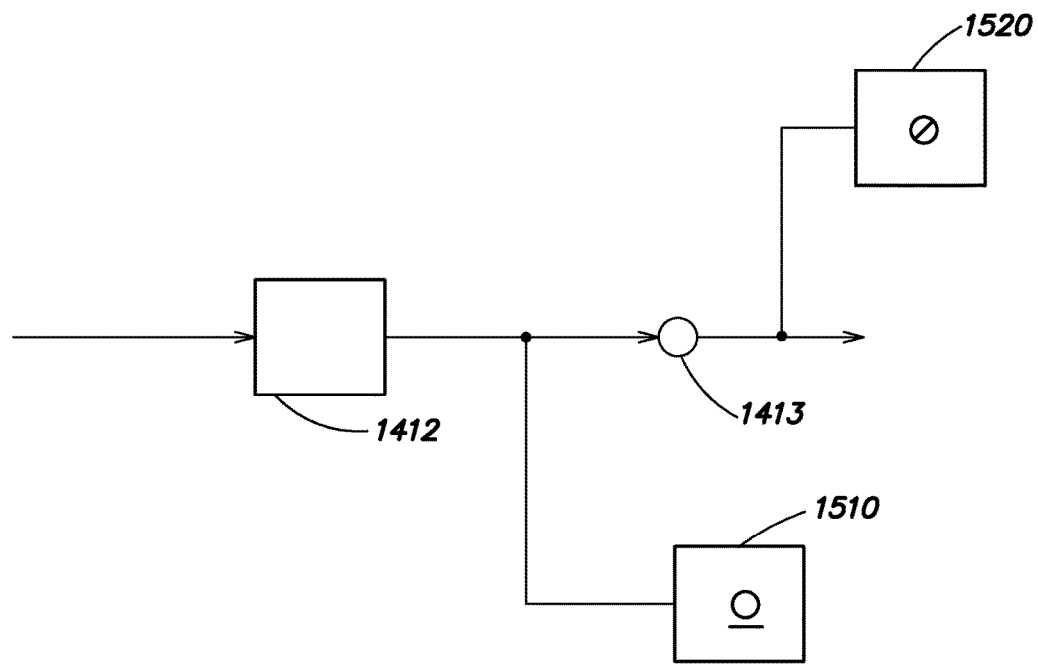

The user may also extract multiple slices from the same model M. The different slices may or may not have components in common. In the example of FIG. 14, the user has also identified a second slice 1450 as a substructure of interest. Slice 1450 includes components 1412 and 1413 and their connections. The system may present individual views for each slice 1410, 1450 as shown in FIGS. 15A and 15B, respectively. When there is complete overlap of one slice by another, such that slice 1450 has all of its components in common with slice 1410, the user may run a single simulation with the same simulation states for both slices 1410, 1450. However when there is not complete overlap, the slices may be simulated independently, as their preserved contexts may differ.

In one example, component 1412 may be a gain block with variable k. If the user changes k in one slice 1410, that change may also propagate automatically to the other slice 1450 also having gain block 1412. In addition, if the user saves the model, the system may separately save both slices 1410, 1450 and their contexts for later retrieval.

Also, executing only slice 1450 may not result in complete execution of slice 1410, and the user may be so notified.

In another aspect, if the user adds components and/or functionality (e.g., instrumentation functionality (e.g., a Scope block), verification functionality (e.g., an assumption block), debugging functionality (e.g., an assertion bock), logging functionality (e.g., a write-to-workspace block), test functionality (e.g., an input sequence block), traceability functionality (e.g., a requirements link), etc.), for example, to monitor an output for a given slice 1450, the components and/or functionality may or may not propagate to the other slice 1410, depending on user preference.

The two slices 1410, 1450 may or may not be loosely coupled, and that information may be maintained with the preserved context to further assist with analysis, transformation, and verification.

Executing the model slice S may behave as executing the full model M. However, the user can interact with just the model slice S of interest, and/or a transformed substructure S' from the original model M. Multiple such model slices may also be extracted from the original model, and some of the multiple model slices may have common elements in the original model. Changes to one of the model slices may be made in the original model but also in other model slices (that share common elements) or not. The various model slices may be stored with the original model in an archive (or project). Also, executing one model slice may execute other model slices as well. In case the other model slices have been extended with functionality (e.g., assertions, logging, properties, etc.) this functionality may also be evaluated automatically.

The foregoing description provides illustration and description, but is not intended to be exhaustive or to limit the embodiments to the precise form disclosed. Modifications and variations are possible in light of the above teachings or may be acquired from practice of the implementations.

As used herein, the term device is intended to be broadly interpreted to refer to hardware or a combination of hardware and software, such as software executed by a processor.

It will be apparent that systems and methods, as described above, may be implemented in many different forms of software, firmware, and hardware in the implementations illustrated in the figures. The actual software code or specialized control hardware used to implement these systems and methods is not limiting of the implementations. Thus, the operation and behavior of the systems and methods were described without reference to the specific software code—it being understood that software and control hardware can be designed to implement the systems and methods based on the description herein.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

No element, act, or instruction used in the present application should be construed as critical or essential unless explicitly described as such. Also, as used herein, the article "a" is intended to include one or more items and may be used interchangeably with the phrase "one or more." Where only one item is intended, the term "one" or similar language is used. Further, the phrase "based on" is intended to mean "based, at least in part, on" unless explicitly stated otherwise.

What is claimed is:

1. A method comprising:
    obtaining a first executable model and a slice included within the first executable model, wherein the first executable model when executed simulating a behavior of a system;
    analyzing, by a processor, the first executable model including the slice to identify at least one feature of the first executable model or the slice;
    transforming, by the processor and after obtaining the slice from within the first executable model, the slice using the at least one feature to obtain a mutated slice representing a simplification of the slice; and
    integrating, by the processor, the mutated slice into the first executable model, from which the slice was obtained, to obtain a mutated model.

2. The method of claim 1 wherein the at least one feature comprises at least one of an input, an output, a state value, an entry point, an exit point, or attributes of a simulation of the first executable model.

3. The method of claim 1 wherein the at least one feature comprises one or more layout features of the slice or the at least one feature is for displaying the slice.

4. A non-transitory computer-readable medium storing program code, the program code comprising one or more instructions that, when executed by one or more processors, cause the one or more processors to:
   obtain a first executable model and a slice included within the first executable model, wherein the first executable model when executed simulating a behavior of a system;
   analyze the first executable model including the slice to identify at least one feature of the first executable model or the slice;
   after obtaining the slice from within the first executable model, transform the slice, using the at least one feature, to obtain a mutated slice representing a simplification of the slice; and
   integrate the mutated slice into the first executable model, from which the slice was obtained, to obtain a mutated model.

5. The non-transitory computer-readable medium of claim 4 wherein the at least one feature comprises at least one of an input, an output, a state value, an entry point, an exit point, or attributes of a simulation of the first executable model.

6. The non-transitory computer-readable medium of claim 4 wherein the at least one feature comprises one or more layout features of the slice or the at least one feature is for displaying the slice.

7. A device comprising:
   one or more processors to:
   obtain a first executable model and a slice included within the first executable model, wherein the first executable model when executed simulating a behavior of a system;
   analyze the first executable model including the slice to identify at least one feature of the first executable model or the slice;
   after obtaining the slice from within the first executable model, transform the slice, using the at least one feature, to obtain a mutated slice representing a simplification of the slice; and
   integrate the mutated slice into the first executable model, from which the slice was obtained, to obtain a mutated model.

8. The device of claim 7 wherein the at least one feature comprises at least one of an input, an output, a state value, an entry point, an exit point, or attributes of a simulation of the first executable model.

9. The device of claim 7 wherein the at least one feature comprises one or more layout features of the slice or the at least one feature is for displaying the slice.

10. The device of claim 9 wherein the layout features include virtual model elements.

11. The device of claim 7 wherein the at least one feature is associated with executing the first executable model.

12. The device of claim 7, wherein the one or more processors further to:
   identify a substructure within the first executable model based on received input indicating the substructure within the first executable model; and
   slice the first executable model to obtain the slice corresponding to the substructure.

13. The device of claim 12 wherein the one or more processers further to determine two or more strongly connected components of a directed graph associated with the first executable model to identify the substructure within the first executable model.

14. The device of claim 12 wherein the substructure comprises one or more of an algebraic loop, a data loop, a control loop, a feedback, feed forward, maximum or minimum network delay, a maximum or minimum path length, parallel paths, a path without dynamics, two or more strongly connected components of a directed graph associated with the first executable model, or blocks or subsystems associated with some other function of the first executable model.

15. A method comprising:
   for a first executable model and a slice included within the first executable model, the first executable model when executed simulating a behavior of a system;
   identifying, by a processor, a substructure within the first executable model based on received input indicating the substructure within the first executable model;
   slicing, by the processor, the first executable model to identify the slice corresponding to the substructure;
   analyzing, by a processor, the first executable model including the slice to identify at least one context of the first executable model or the slice;
   transforming, by the processor and after identifying the slice from within the executable model, the slice to obtain a mutated slice that is different from the slice, wherein the transforming preserves the at least one context of the first executable model or the slice; and
   integrating, by the processor, the mutated slice into the first executable model from which the slice was identified to obtain a mutated model.

16. The method of claim 15 wherein the identifying a substructure further comprises determining two or more strongly connected components of a directed graph associated with the first executable model.

17. The method of claim 15 wherein the substructure comprises one or more of an algebraic loop, a data loop, a control loop, a feedback, feed forward, maximum or minimum network delay, a maximum or minimum path length, parallel paths, a path without dynamics, two or more strongly connected components of a directed graph associated with the first executable model, or blocks or subsystems associated with some other function of the first executable model.

18. The method of claim 15, wherein the first executable model is a hierarchical model, the method further comprising:
   flattening at least a portion of the first executable model to obtain a flattened model; and
   using the flattened model for identifying the slice.

19. The method of claim 15 wherein the mutated model is a hierarchical model, and integrating the mutated slice further comprises:
   placing the mutated slice in a first hierarchical level of the mutated model that is higher than a second hierarchical level where the slice was located in the first executable model.

20. The method of claim 15 further comprising:
   displaying a graphical representation of the first executable model; and
   visually distinguishing the slice on the graphical representation.

21. The method of claim 15 wherein the at least one context comprises at least one of an input, an output, a state value, an entry point, an exit point, or attributes of a simulation of the first executable model.

22. The method of claim 15 wherein the at least one context comprises one or more layout features of the slice or the at least one context is for displaying the slice.

23. The method of claim 22 wherein the layout features include virtual model elements.

24. The method of claim 15 further comprising:
receiving a change in the first executable model; and
in response to the change in the first executable model, updating the mutated slice.

25. The method of claim 15 wherein slicing extracts two or more slices from the first executable model, the two or more slices including at least one component in common.

26. The method of claim 25 further comprising:
transforming one of the slices, of the two or more slices, with the common component to obtain a change in the mutated slice; and
propagating the change to a second slice, of the two or more slices, with the common component to obtain a second mutated slice.

27. The method of claim 15 wherein transforming the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

28. The method of claim 15 further comprising:
verifying the mutated model by simulating the mutated slice with the first executable model.

29. The method of claim 28 wherein verifying the mutated model further comprises:
running a simulation of the mutated model as a foreground process; and
running a simulation of the first executable model as a background process.

30. The method of claim 15 wherein the slice includes multiple slices that each have a given sample rate.

31. The method of claim 19 wherein the transforming the slice further comprises collapsing the multiple slices that each have a given sample rate into the mutated slice.

32. The method of claim 15 wherein the transforming further comprises:
maintaining a local workspace for storing the at least one context for the mutated slice.

33. The method of claim 15 wherein the transforming further comprises using a single linear solver to transform the slice to obtain the mutated slice.

34. The method of claim 15 wherein the analyzing further comprises:
identifying loosely coupled slices; and
simulating the mutated slice in the first executable model by running simulations of at least two of the loosely coupled slices in parallel.

35. The method of claim 15 further comprising:
outputting, text representing the slice, to a file or a display.

36. The method of claim 15 wherein the at least one context is associated with executing the first executable model.

37. A system comprising:
one or more processors for:
identifying a substructure within a first executable model based on received input indicating the substructure within the first executable model, wherein the first executable model includes a slice and wherein the first executable model when executed simulating a behavior of a system;
slicing the first executable model to identify the slice corresponding to the substructure;
analyzing the first executable model including the slice to identify at least one context of the first executable model or the slice;
transforming, after identifying the slice from within the executable model, the slice to obtain a mutated slice that is different from the slice, wherein the transforming preserves the at least one context of the first executable model or the slice; and
integrating the mutated slice into the first executable model from which the slice was identified to obtain a mutated model.

38. The system of claim 37 wherein transforming the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

39. A non-transitory computer-readable medium storing program code, the program code comprising one or more instructions that, when executed by one or more processors, cause the one or more processors to:
identify a substructure within a first executable model based on received input indicating the substructure within the first executable model, wherein the first executable model includes a slice and wherein the first executable model when executed simulating a behavior of a system;
slice the first executable model to identify the slice corresponding to the substructure;
analyze the first executable model including the slice to identify at least one context of the first executable model or the slice;
transform, after identifying the slice from within the executable model, the slice to obtain a mutated slice that is different from the slice, wherein the transform preserves the at least one context of the first executable model or the slice; and
integrate the mutated slice into the first executable model from which the slice was identified to obtain a mutated model.

40. The non-transitory computer-readable medium of claim 39 wherein transform the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

41. A method comprising:
for a first executable model and a slice included within the first executable model, the first executable model when executed simulating a behavior of a system;
analyzing, by a processor, the first executable model including the slice to identify at least one context of the first executable model or the slice;
transforming, by the processor and after identifying the slice from within the executable model, the slice to obtain a mutated slice that is different from the slice, wherein the transforming preserves the at least one context of the first executable model or the slice, and wherein the at least one context includes information configured to be used to produce a response or a behavior of a simulation of the mutated slice that corresponds to a response or a behavior of a simulation of the slice in the first executable model; and integrating, by the processor, the mutated slice into the first executable model from which the slice was identified to obtain a mutated model.

42. The method of claim 41 wherein transforming the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

43. A system comprising:

one or more processors for:

analyzing a first executable model including a slice to identify at least one context of the first executable model or the slice, wherein the first executable model when executed simulating a behavior of a system;

transforming, after identifying the slice from within the executable model, the slice to obtain a mutated slice that is different from the slice, wherein the transforming preserves the at least one context of the first executable model or the slice, and wherein the at least one context includes information configured to be used to produce a response or a behavior of a simulation of the mutated slice that corresponds to a response or a behavior of a simulation of the slice in the first executable model; and integrating the mutated slice into the first executable model from which the slice was identified to obtain a mutated model.

44. The system of claim 43 wherein transforming the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

45. A non-transitory computer-readable medium storing program code, the program code comprising one or more instructions that, when executed by one or more processors, cause the one or more processors to:

analyze a first executable model including a slice to identify at least one context of the first executable model or the slice, wherein the first executable model when executed simulating a behavior of a system;

transform, after identifying the slice from within the executable model, the slice to obtain a mutated slice that is different from the slice, wherein the transform preserves the at least one context of the first executable model or the slice, and wherein the at least one context includes information configured to be used to produce a response or a behavior of a simulation of the mutated slice that corresponds to a response or a behavior of a simulation of the slice in the first executable model; and integrate the mutated slice into the first executable model from which the slice was identified to obtain a mutated model.

46. The non-transitory computer-readable medium of claim 45 wherein transform the slice, to obtain the mutated slice, comprises at least one of memoization, lookup table conversion, determining a closed form function call, or providing a local solver, a numeric integration solver, a linear solver, a non-linear solver, or a zero-crossing detector-based solver.

* * * * *